United States Patent
Yoo et al.

(10) Patent No.: US 11,436,951 B2
(45) Date of Patent: Sep. 6, 2022

(54) DISPLAY DEVICE

(71) Applicant: Samsung Display Co., LTD., Yongin-si (KR)

(72) Inventors: Jewon Yoo, Seoul (KR); Seungin Baek, Seongnam-si (KR); Sang-Gu Lee, Yongin-si (KR); Hyunjin Son, Namyangju-si (KR); Daewook Kim, Yecheon-gun (KR)

(73) Assignee: Samsung Display Co., Ltd., Yongin-si (KR)

( * ) Notice: Subject to any disclaimer, the term of this patent is extended or adjusted under 35 U.S.C. 154(b) by 55 days.

(21) Appl. No.: 17/024,583

(22) Filed: Sep. 17, 2020

(65) Prior Publication Data
US 2021/0192984 A1    Jun. 24, 2021

(30) Foreign Application Priority Data

Dec. 19, 2019    (KR) .......................... 10-2019-0170831

(51) Int. Cl.
  *G09F 9/30*    (2006.01)
  *G06F 1/16*    (2006.01)
  *H04M 1/02*    (2006.01)
(52) U.S. Cl.
  CPC ............ *G09F 9/301* (2013.01); *G06F 1/1652* (2013.01); *H04M 1/0268* (2013.01)
(58) Field of Classification Search
  CPC combination set(s) only.
  See application file for complete search history.

(56) References Cited

U.S. PATENT DOCUMENTS

| | | | | |
|---|---|---|---|---|
| 8,506,152 | B2* | 8/2013 | Kim | G02B 6/0045 362/617 |
| 9,176,701 | B2* | 11/2015 | Becze | G06F 3/017 |
| 9,354,476 | B2* | 5/2016 | Han | G06F 1/1681 |
| 10,082,691 | B2* | 9/2018 | Kim | G02F 1/133308 |
| 10,303,218 | B2* | 5/2019 | Jones | G06F 1/1618 |
| 10,727,435 | B2* | 7/2020 | Kim | G06F 1/1601 |
| 11,048,295 | B1* | 6/2021 | Smeeton | G06F 1/1652 |
| 11,132,027 | B2* | 9/2021 | Park | G06F 1/1652 |
| 11,216,034 | B2* | 1/2022 | Park | G06F 1/1652 |
| 2015/0043174 | A1* | 2/2015 | Han | G06F 1/1652 361/749 |
| 2019/0025886 | A1* | 1/2019 | Ryu | G06F 1/1641 |
| 2021/0192984 | A1* | 6/2021 | Yoo | G09F 9/301 |

(Continued)

FOREIGN PATENT DOCUMENTS

| KR | 10-2016-0117799 | 10/2016 |
| KR | 10-2017-0122554 | 11/2017 |
| KR | 10-2019-0075715 | 7/2019 |

*Primary Examiner* — Lisa Lea-Edmonds
(74) *Attorney, Agent, or Firm* — H.C. Park & Associates, PLC

(57) ABSTRACT

A display device includes a display module; and a layer disposed on the display module and having a first area and a second area adjacent to the first area, the layer in the first area including a plurality of discontinuities spaced apart from each other. A sum of widths of the plurality of discontinuities is less than about 0.23 times of a width of the first area, each of the widths of the plurality of discontinuities is equal to or less than about 400 μm, and the widths of the plurality of discontinuities and the width of the first area are parallel to a first direction.

20 Claims, 24 Drawing Sheets

(56) References Cited

U.S. PATENT DOCUMENTS

2021/0233447 A1\* 7/2021 Park .................... G06F 1/1681
2021/0247804 A1\* 8/2021 Ha ...................... G06F 1/1652
2021/0271002 A1\* 9/2021 Koo ........................ B32B 7/12
2021/0303091 A1\* 9/2021 Son ................. G02F 1/133509

\* cited by examiner

FIG. 1B
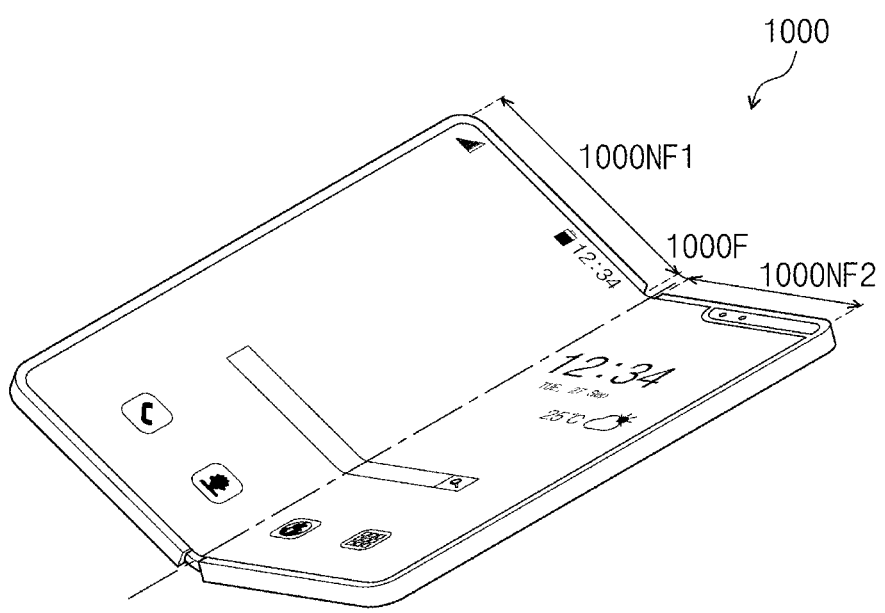
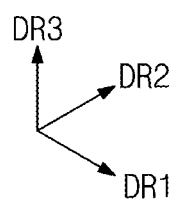

FIG. 2
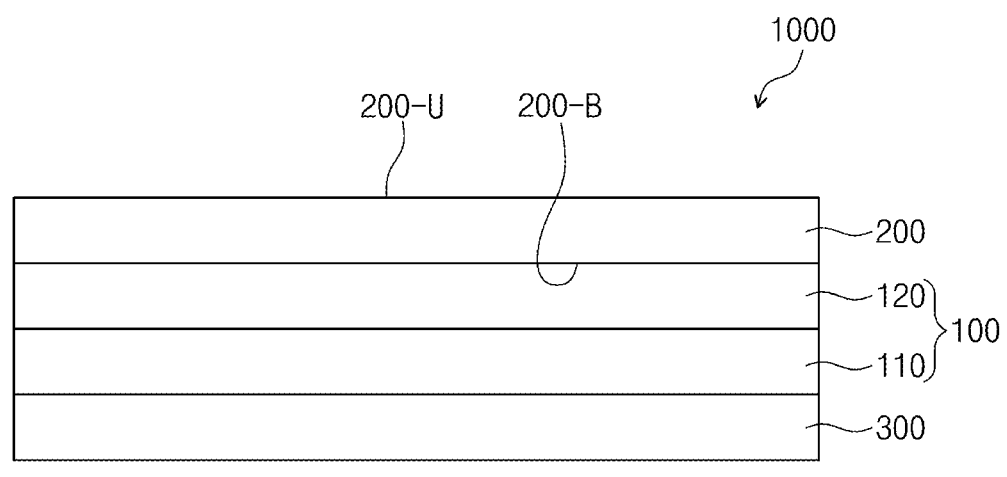
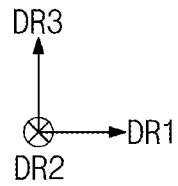

FIG. 4
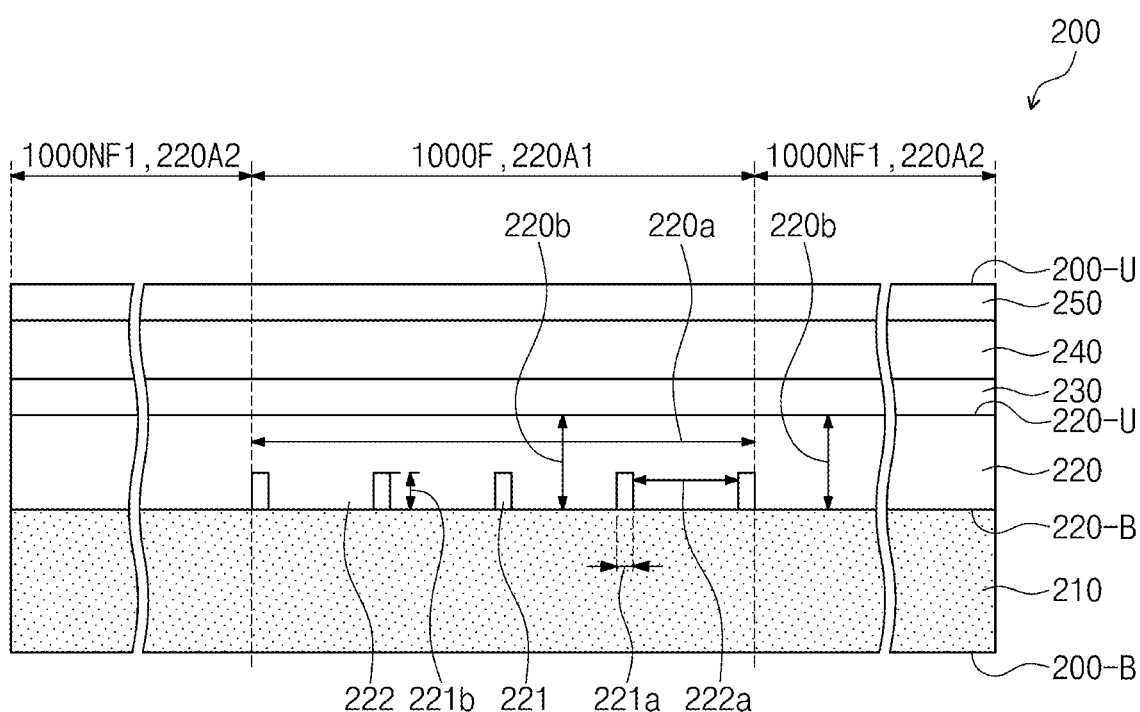
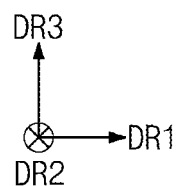

FIG. 8
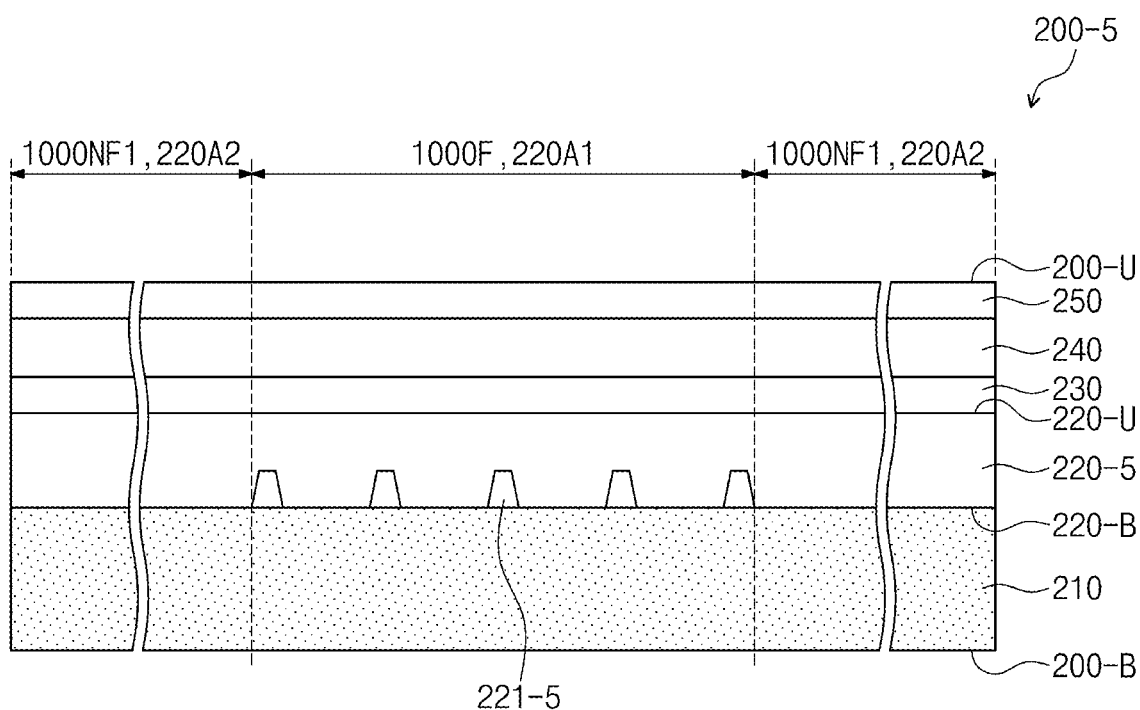
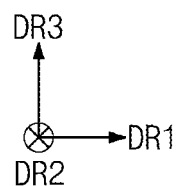

FIG. 9
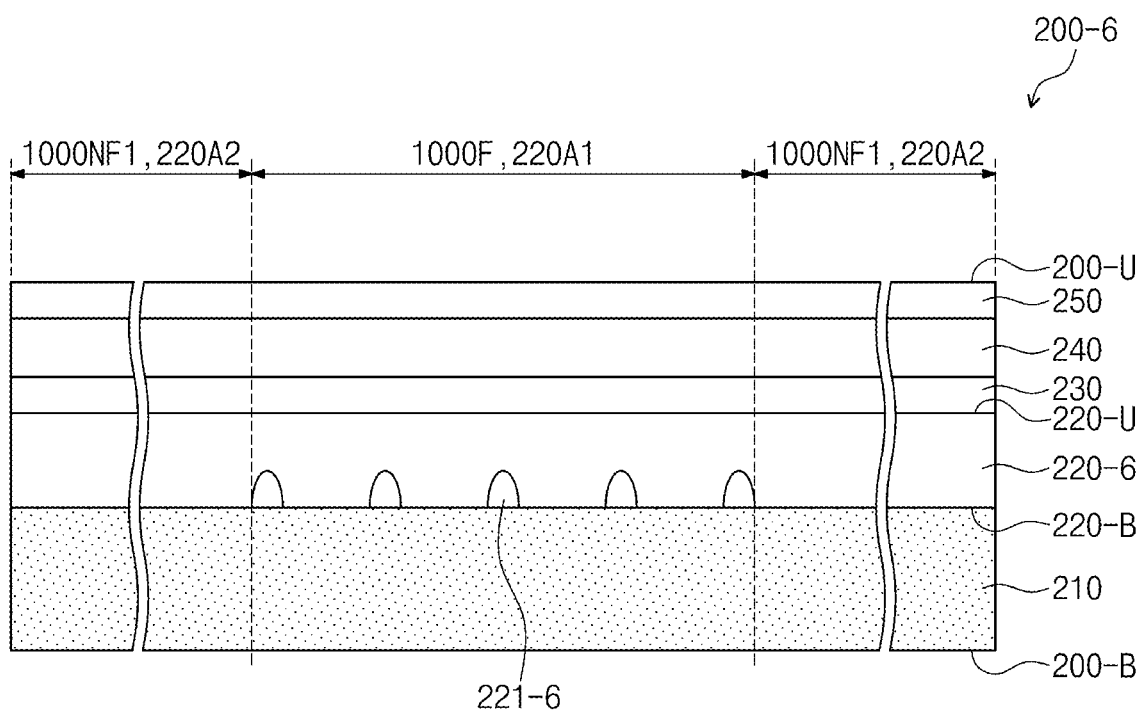
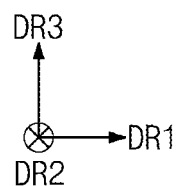

FIG. 20
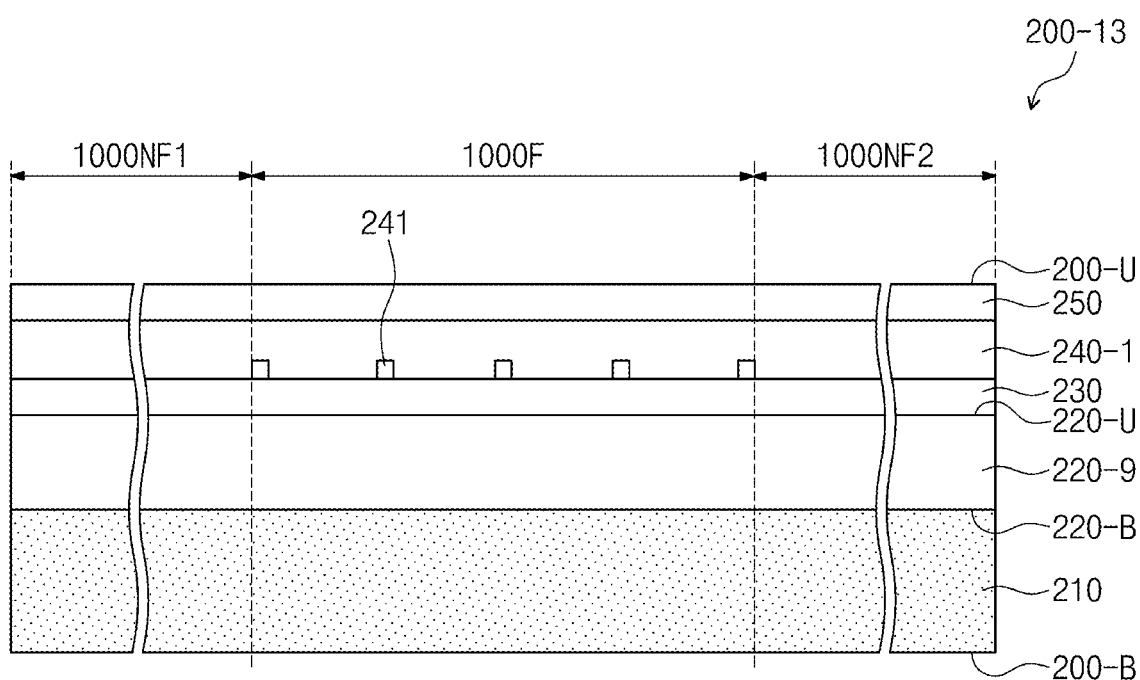
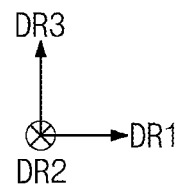

DISPLAY DEVICE

CROSS REFERENCE TO RELATED APPLICATION

This application claims priority from and the benefit of Korean Patent Application No. 10-2019-0170831 filed on Dec. 19, 2019, which is hereby incorporated by reference for all purposes as if fully set forth herein.

BACKGROUND

Field

Exemplary implementations of the invention relate generally to a display device, and more specifically, to a display device with a foldable window.

Discussion of the Background

A display device displays various images on its display screen to provide information to users. In general, the display device displays information on a screen. Flexible display devices have recently been developed to include flexible display panels capable of being folded. Unlike rigid display devices, the flexible display devices can be foldable, rollable, or bendable. The flexible display device, which is deformable into various shapes, can be implemented regardless of its existing screen size to thereby improve user convenience.

The above information disclosed in this Background section is only for understanding of the background of the inventive concepts, and, therefore, it may contain information that does not constitute prior art.

SUMMARY

Applicant discovered that the window of a flexible display device may be wrinkled or cracked due to frequent folding and unfolding operations.

Display devices with a foldable window constructed according to the principles and exemplary implementations of the invention have improved reliability in the folding and unfolding operations thereof. For example, the foldable window of the display devices includes on or more protective layers having discontinuities, such as grooves, to prevent the window from being wrinkled or cracked by the frequent folding and unfolding operations. Thus, the window of the display devices may have improved folding characteristics.

According to one aspect of the invention, a display device includes: a display module; and a layer disposed on the display module and having a first area and a second area adjacent to the first area, the layer in the first area including a plurality of discontinuities spaced apart from each other, wherein: a sum of widths of the plurality of discontinuities is less than about 0.23 times of a width of the first area, each of the widths of the plurality of discontinuities is equal to or less than about 400 and the widths of the plurality of discontinuities and the width of the first area are parallel to a first direction.

The layer may include a bottom surface facing the display module and a top surface spaced apart from the display module across the bottom surface, wherein each of the plurality of discontinuities may be recessed from the bottom surface in a direction toward the top surface.

The layer may include a bottom surface facing the display module and a top surface spaced apart from the display module across the bottom surface, wherein each of the plurality of discontinuities may be recessed from the top surface in a direction toward the bottom surface.

The plurality of discontinuities may be spaced apart from each other by substantially the same interval.

The plurality of discontinuities may include a first discontinuity, a second discontinuity, and a third discontinuity that are sequentially arranged along the first direction, wherein a distance between the first discontinuity and the second discontinuity may be different from a distance between the second discontinuity and the third discontinuity.

The plurality of discontinuities may include a first discontinuity and a second discontinuity that are spaced apart from each other along the first direction, wherein a width substantially parallel to the first direction of the first discontinuity may be different from a width substantially parallel to the first direction of the second discontinuity.

When viewed in cross-section, each of the plurality of discontinuities may include a groove having a square shape, a trapezoidal shape, an inverse trapezoidal shape, or a lenticular shape.

The plurality of discontinuities may include a plurality of grooves and air is disposed in at least a portion of the plurality of grooves.

The display device may further include an adhesive attached to the layer, wherein a portion of the adhesive may be disposed in at least a portion of the plurality of discontinuities.

The plurality of discontinuities may include a plurality of grooves and the display device may further include an adhesive attached to the layer, wherein air may be disposed in a portion of each of the plurality of grooves, and wherein a portion of the adhesive may be disposed in another portion of each of the plurality of grooves.

Each of the plurality of discontinuities may have a width less than an interval between two adjacent discontinuities.

The plurality of discontinuities may include a plurality of grooves and each of the plurality of grooves has a depth less than a thickness of the layer.

The layer may include a protective layer including a tempered glass or a synthetic resin film.

The plurality of discontinuities may be spaced apart from each other in the first direction, and each of the plurality of discontinuities may extend in a second direction intersecting the first direction.

The plurality of discontinuities may be spaced apart from each other in the first direction and a second direction intersecting the first direction.

According to another aspect of the invention, a display device includes: a display module; and a window disposed on the display module, the window including a bottom surface facing the display module and a top surface spaced apart from the display module across the bottom surface, wherein the window includes a plurality of discontinuities in the bottom surface that are spaced apart from each other along a first direction.

The window may include a first area overlapping the plurality of discontinuities and a second area adjacent to the first area, wherein a boundary between the first area and the second area may overlap a sidewall of an outermost one of the plurality of discontinuities, and wherein a sum of widths of the plurality of discontinuities may be less than about 0.23 times of a width of the first area and greater than about zero times of the width of the first area, the widths of the plurality of discontinuities and the width of the first area being substantially parallel to the first direction.

Each of the plurality of discontinuities may have a width greater than zero μm and equal to or less than about 400 μm.

Each of the plurality of discontinuities may have a width less than an interval between two adjacent discontinuities.

The plurality of discontinuities may include a plurality of grooves recessed in a direction extending from the bottom surface to the top surface and one or more of air and an adhesive material are disposed in each of the plurality of grooves.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 1B is a perspective view of the display device of FIG. 1A illustrating an operational state.

FIG. 2 is a cross-sectional view of the display device of FIG. 1A.

FIG. 4 is a cross-sectional view of an exemplary embodiment of an upper layer of FIG. 2.

FIG. 8 is a cross-sectional view of another exemplary embodiment of the upper layer of FIG. 2.

FIG. 9 is a cross-sectional view of another exemplary embodiment of the upper layer of FIG. 2.

FIG. 20 is a cross-sectional view of another exemplary embodiment of the upper layer of FIG. 2.

DETAILED DESCRIPTION

Figure 1A:
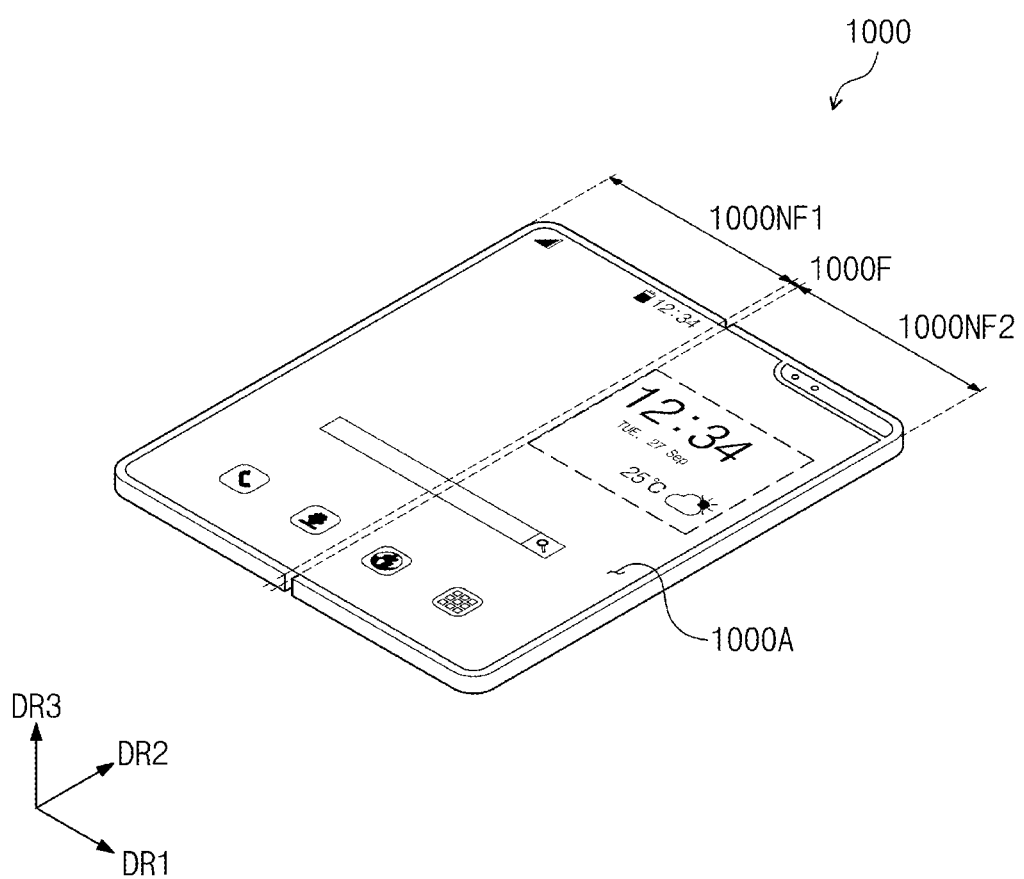
FIG. 1A is a perspective view of an exemplary embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1A is a perspective view of an exemplary embodiment of a display device constructed according to the principles of the invention. FIG. 1B is a perspective view of the display device of FIG. 1A illustrating an operational state.

Referring to FIGS. 1A and 1B, a display device 1000 may be an apparatus that is activated by an electrical signal. For example, the display device 1000 may include a mobile phone, a tablet computer, an automotive navigation system, a game console, or a wearable apparatus, but exemplary embodiments are not limited thereto. FIG. 1A exemplarily shows a mobile phone as an exemplary embodiment of the display device 1000.

The display device 1000 may be a foldable display device. The display device 1000 may include a first non-foldable area 1000NF1, a foldable area 1000F, and a second non-foldable area 1000NF2 that are sequentially defined along a first direction DR1. For example, the foldable area 1000F may be disposed between the first non-foldable area 1000NF1 and the second non-foldable area 1000NF2.

FIGS. 1A and 1B show one foldable area 1000F and two non-foldable areas 1000NF1 and 1000NF2, but exemplary embodiments are not limited to the number of the foldable area 1000F or the number of the non-foldable areas 1000NF1 and 1000NF2. For example, the display device 1000 may include three or more non-foldable areas and a plurality of foldable areas disposed between the three or more non-foldable areas.

The display device 1000 may display an image on an active area 1000A. In an unfolded position, the active area 1000A may include a surface substantially parallel to a plane defined by first and second directions DR1 and DR2. The thickness direction of the display device 1000 may be substantially parallel to a third direction DR3 that intersects the first and second directions DR1 and DR2. Therefore, the third direction DR3 may be used to distinguish front and rear (or top and bottom) surfaces of components that constitute the display device 1000.

When the display device 1000 is folded inwardly, the first and second non-foldable areas 1000NF1 and 1000NF2 may become closer to each other such that display surfaces face each other. Thus, the active area 1000A may not be exposed outside when the display device 1000 is in a completely folded position. This position may be referred to as an inwardly-folded position. This position, however, is an example, and exemplary embodiments are not limited thereto.

When the display device 1000 is folded outwardly, the first and second non-foldable areas 1000NF1 and 1000NF2 may become closer to each other such that the display surfaces face in opposite directions. Thus, in the folded position, the active area 1000A may be externally exposed. This may be referred to as an outwardly-folded position. The display device 1000 may be manipulated into the inwardly-folded or outwardly-folded position. For example, the foldable area 1000F may be bent according to the inwardly-folded and outwardly-folded positions. Alternatively, the display device 1000 may include a plurality of foldable areas, some of the plurality of foldable areas may be bent in the inwardly-folded position, and other of the plurality of foldable areas may be bent in the outwardly-folded position.

FIG. 2 is a cross-sectional view of the display device of FIG. 1A.

Referring to FIG. 2, the display device 1000 may include a display module 100, an upper layer 200, and a lower layer 300.

The display module 100 may display an image and may detect an external input. The external input may be a user input. The user input may include a user's body, light, heat, pen, pressure, or various other types of input.

The display module 100 may include a display panel 110 to generate the image and an input sensor 120 to obtain coordinate information of the external input.

The display panel 110 may be, but the exemplary embodiments are not limited thereto, an emissive display panel. For example, the display panel 110 may include an organic light emitting display panel or a quantum-dot light emitting display panel. An emission layer of the organic light emitting display panel may include an organic light emitting material. An emission layer of the quantum-dot light emitting display panel may include a quantum-dot or a quantum-rod.

The input sensor 120 may be disposed above or on the display panel 110. The input sensor 120 may detect the external input by using a mutual capacitance method or a self-capacitance method. The external input detection method, however, is not limited to the exemplary embodiments mentioned above.

The upper layer 200 may be disposed above or on the display module 100. The display module 100 may be configured to display the image in a direction toward the upper layer 200. The upper layer 200 may be disposed on and may protect the display module 100. The upper layer 200 will be further discussed in detail below.

The lower layer 300 may be disposed below the display module 100. The lower layer 300 may protect a bottom surface of the display module 100. For example, the lower layer 300 may include a synthetic resin film, such as a polyimide film or a polyethylene terephthalate film, and a cushion layer that is disposed below the synthetic resin film and includes a sponge, a foam material, or a urethane resin.

Figure 3:
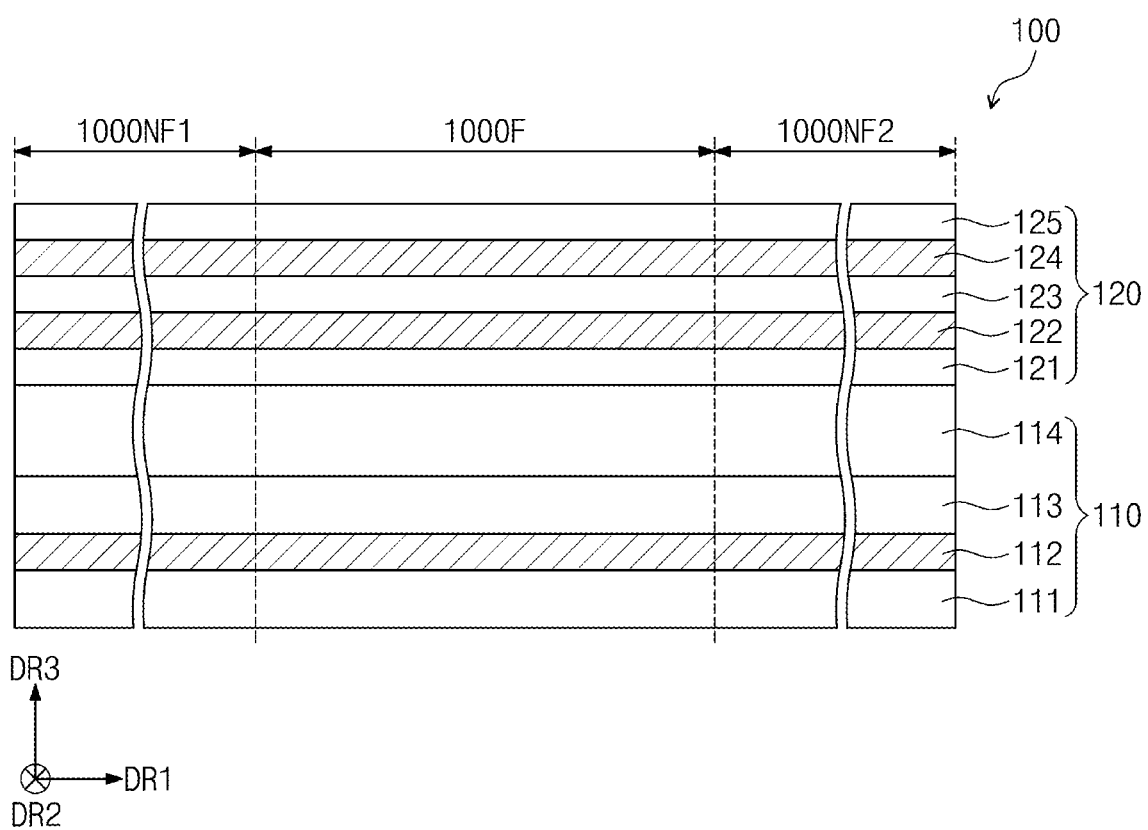
FIG. 3 is a cross-sectional view of a display module of FIG. 2.

FIG. 3 is a cross-sectional view of a display module of FIG. 2.

Referring to FIG. 3, an example will be explained in which the display panel 110 is an organic light emitting display panel.

The display panel 110 may include a base layer 111, a circuit element layer 112 disposed on the base layer 111, a display element layer 113, and a thin-film encapsulation layer 114. For example, the display panel 110 may further include functional layers such as a buffer layer or a refractive index adjustment layer.

The base layer 111 may include a synthetic resin film. A synthetic resin layer may be formed on a workpiece substrate used for the fabrication of the display panel 110. Afterwards, a conductive layer, a dielectric layer, or the like may be formed on the synthetic resin layer. When the workpiece substrate is removed, the synthetic resin layer may correspond to the base layer 111. The synthetic resin layer may include a thermosetting resin. For example, the synthetic resin layer may be a polyimide-based resin layer, but exemplary embodiments are not limited to its material. The base layer 111 may include at least one of a glass substrate, a metal substrate, and an organic/inorganic composite substrate.

The circuit element layer 112 may include a dielectric layer and a circuit element. Hereinafter, the dielectric layer included in the circuit element layer 112 is an intermediate dielectric layer. The intermediate dielectric layer may include at least one intermediate inorganic layer and/or at least one intermediate organic layer. The circuit element may include a signal line, a pixel driver circuit, or the like. The circuit element layer 112 may be formed by formation processes in which dielectric, semiconductor, and conductive layers are coated or deposited, and by patterning processes in which photolithography is used to pattern the dielectric, semiconductor, and conductive layers.

The display element layer 113 may include a light emitting element. The display element layer 113 may include organic light emitting diodes. The display element layer 113 may further include an organic layer such as a pixel definition layer.

The thin-film encapsulation layer 114 may encapsulate the display element layer 113. The thin-film encapsulation layer 114 may include at least one dielectric layer. The thin-film encapsulation layer 114 according to an exemplary embodiment may include at least one inorganic layer (referred to hereinafter as an encapsulation inorganic layer). The thin-film encapsulation layer 114 according to some exemplary embodiments may include at least one organic layer (referred to hereinafter as an encapsulation organic layer) and at least one encapsulation inorganic layer.

The encapsulation inorganic layer may protect the display element layer 113 from moisture/oxygen, and the encapsulation organic layer may protect the display element layer 113 from impurities such as dust particles. The encapsulation inorganic layer may include a silicon nitride layer, a silicon oxynitride layer, a silicon oxide layer, a titanium oxide layer, or an aluminum oxide layer, but exemplary embodiments are not limited thereto. The encapsulation organic layer may include an acryl-based organic layer, but exemplary embodiments are not limited thereto.

The input sensor 120 may include a base dielectric layer 121, a first conductive layer 122, a first dielectric layer 123, a second conductive layer 124, and a second dielectric layer 125.

The base dielectric layer 121 may be an inorganic layer that includes one or more of silicon nitride, silicon oxynitride, and silicon oxide. Alternatively, the base dielectric layer 121 may be an organic layer that includes an epoxy-based resin, an acryl-based resin, or an imide-based resin. The base dielectric layer 121 may be directly formed on the display panel 110. Alternatively, the base dielectric layer 121 may be formed on a separate base layer, and an adhesive member may be used to couple the separate base layer to the display panel 110. In another embodiment, the base dielectric layer 121 may be omitted.

Each of the first and second conductive layers 122 and 124 may include sensing electrodes or signal lines. Each of the first and second conductive layers 122 and 124 may have a single-layered structure or a multi-layered structure in which layers are stacked on each other in the third direction DR3. For example, each of the first and second conductive layers 122 and 124 may be a single-layered conductive layer or a multi-layered conductive layer. The single-layered conductive layer may include a metal layer or a transparent conductive layer. The metal layer may include one or more of molybdenum, silver, titanium, copper, and any alloy thereof. The transparent conductive layer may include transparent conductive oxide, such as indium tin oxide (ITO), indium zinc oxide (IZO), zinc oxide (ZnO), or indium tin zinc oxide (ITZO). In another exemplary embodiment, the transparent conductive layer may include conductive polymer such PEDOT, metal nano-wires, or graphene.

The multi-layered conductive layer may include a plurality of metal layers. The plurality of metal layers may have, for example, a triple structure of titanium/aluminum/titanium. The multi-layered conductive layer may include at least one metal layer and at least one transparent conductive layer.

Each of the first and second dielectric layers 123 and 125 may have a single-layered structure or a multi-layered structure. Each of the first and second dielectric layers 123 and 125 may include an inorganic material, an organic material, or a composite material.

One or more of the first and second dielectric layers 123 and 125 may include an inorganic layer. The inorganic layer may include one or more of aluminum oxide, titanium oxide, silicon oxide, silicon oxynitride, zirconium oxide, and hafnium oxide.

One or more of the first and second dielectric layers 123 and 125 may include an organic layer. The organic layer may include one or more of an acryl-based resin, methacryl-based resin, polyisoprene, a vinyl-based resin, an epoxy-based resin, a urethane-based resin, a cellulose-based resin, a siloxane-based resin, a polyimide-based resin, a polyamide-based resin, and a perylene-based resin.

Figure 5:
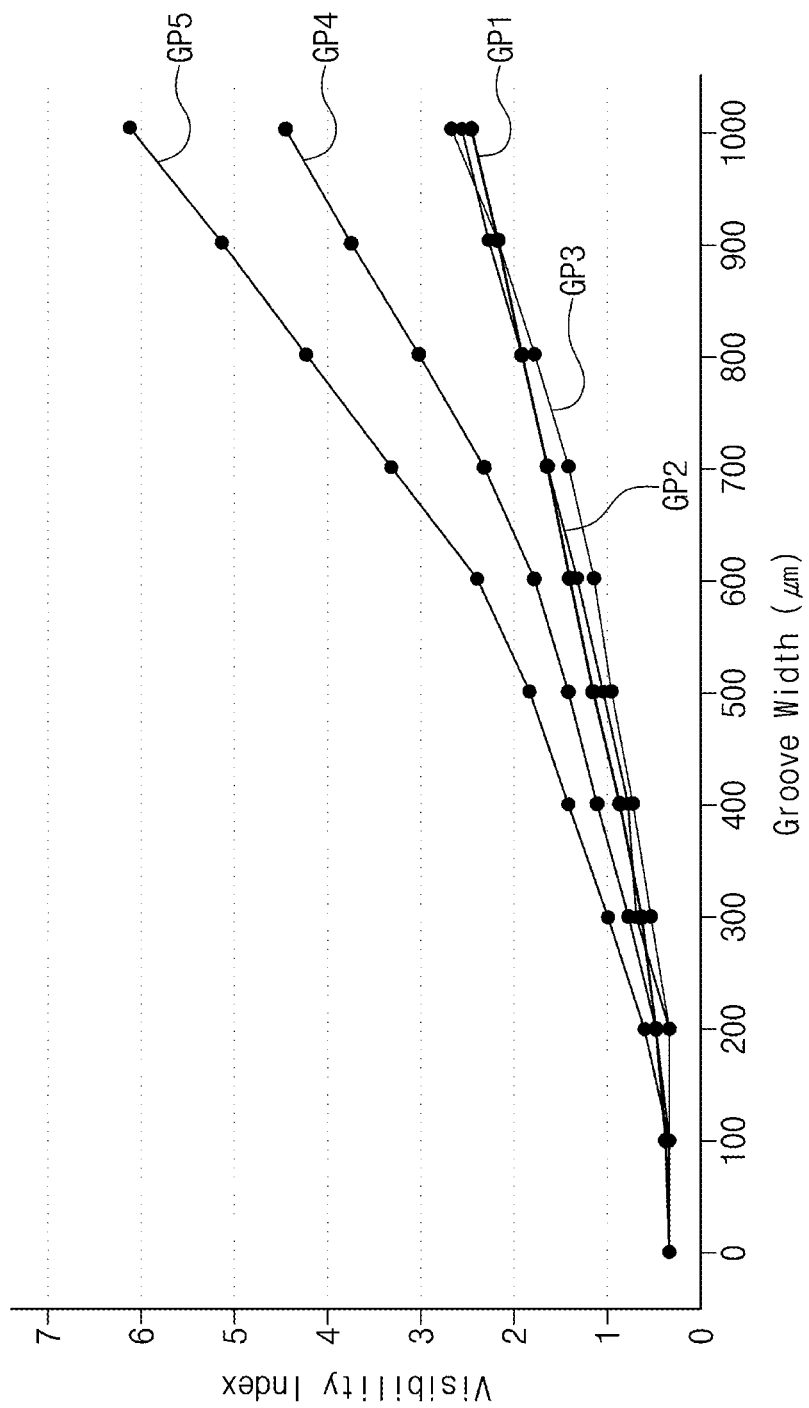
FIG. 5 is a graph illustrating the relationship between visibility indices and the numbers and widths of the grooves in the upper layer of FIG. 2.

FIG. 4 is a cross-sectional view of an exemplary embodiment of an upper layer of FIG. 2. FIG. 5 a graph illustrating the relationship between visibility indices and the numbers and widths of the grooves in the upper layer of FIG. 2.

Referring to FIG. 4, the upper layer 200 may include a first adhesive layer 210, a first protective layer 220, a second adhesive layer 230, a second protective layer 240, and a functional coating layer 250 that are sequentially stacked on each other in the third direction DR3. The first adhesive layer 210 may constitute a bottom surface 200-B of the upper layer 200, and the functional coating layer 250 may constitute a top surface 200-U of the upper layer 200.

FIG. 4 shows an example of components that constitute the upper layer 200, and exemplary embodiments are not limited to the components. For example, the upper layer 200 may include one or more of the components discussed above. In another exemplary embodiment, the upper layer 200 may further include one or more layers other than the components discussed above. The stacking sequence of the components that constitute the upper layer 200 is not limited to the exemplary embodiment shown in FIG. 4.

Each of the first and second adhesive layers 210 and 230 may include any known adhesive or glue. For example, each of the first and second adhesive layers 210 and 230 may be a transparent adhesive member, such as a pressure sensitive adhesive (PSA) film, an optically clear adhesive (OCA) film, or an optically clear resin (OCR).

The first adhesive layer 210 may be disposed above or on the display module 100 of FIG. 2. The upper layer 200 may be attached through the first adhesive layer 210 to the display module 100 of FIG. 2.

The first protective layer 220 may be disposed above or on first adhesive layer 210. The first protective layer 220 may be a window. The first protective layer 220 may include a tempered glass, for example, an ultra-thin-film tempered glass. The ultra-thin-film tempered glass may be referred to as an ultra-thin glass. The ultra-thin-film tempered glass may have a maximum thickness equal to or lower than several hundreds of micrometers. For example, the maximum thickness of the ultra-thin-film tempered glass may be about 50 μm or less.

The ultra-thin-film tempered glass may have a scratch resistance greater than that of a polyimide film, such that when the ultra-thin-film tempered glass is used for the first protective layer 220, the display device 1000 of FIG. 1A may have improved or enhanced resistance against impact or cracking. In addition, when the ultra-thin-film tempered glass is used to form the first protective layer 220, it may be possible to reduce the occurrence of wrinkles forming at the foldable area 1000F and also to reduce or prevent buckling issues.

The first protective layer 220 may include a bottom surface 220-B that faces the display module 100 of FIG. 2 and a top surface 220-U that is spaced apart from the display module 100 across the bottom surface 200-B. The bottom surface 200-B is disposed between the top surface 220-U and the display module 100.

In order to improve folding characteristics of the first protective layer 220, a plurality of discontinuities such as grooves 221 may be formed in the first protective layer 220. The grooves 221 may be spaced apart from each other in the first direction DR1, and may be recessed from the bottom surface 220-B toward the top surface 220-U. The grooves 221 may be filled with air. For example, the grooves 221 may be an empty space.

The first protective layer 220 may have a first area 220A1 in which the grooves 221 are formed. The first area 220A1 is defined between second areas 220A2 adjacent to the first area 220A1. A boundary between the first area 220A1 and one of the second areas 220A2 may overlap a sidewall of an outermost one of the grooves 221. In addition, the first area 220A1 may be included in the foldable area 1000F, and the second areas 220A2 may be included in the first and second non-foldable areas 1000NF1 and 1000NF2.

The first protective layer 220 may have a pattern section 222 corresponding to a portion disposed between the grooves 221 of the first protective layer 220. In the first area 220A1, one groove 221 and one pattern section 222 may be repeatedly and alternately arranged in the first direction DR1.

The depth 221*b* of each groove 221 may be less than the thickness 220*b* of the first protective layer 220 in the second areas 220A2. For example, the thickness 220*b* of the first protective layer 220 in a region, in which the pattern section 222 is disposed, may be substantially the same the thickness 220*b* in the second areas 220A2.

According to an exemplary embodiment, the first protective layer 220 may have a portion that overlaps the foldable area 1000F. The grooves 221 may improve folding characteristics of the portion of the first protective layer 220 in the foldable area 1000F. In addition, the first protective layer 220 may have other portions that overlap the first and second non-foldable areas 1000NF1 and 1000NF2. The other portions of the first protective layer 220 in the first and second non-foldable areas 1000NF1 and 1000NF2 may have thicknesses approximately equal to or greater than a certain value such that the first protective layer 220 may have improved or enhanced resistance against impact or cracking.

The sum of widths 221*a* of the grooves 221 and widths 222*a* of the pattern sections 222 may be substantially the same as width 220*a* of the first area 220A1. The widths 220*a*, 221*a*, and 222*a* may each be a width in a direction parallel to the first direction DR1.

The widths 221*a* of the grooves 221 may be different from the widths 222*a* of the pattern sections 222. For example, the widths 221*a* of the grooves 221 may be less than the widths 222*a* of the pattern sections 222. Alternatively, the widths 221a of the grooves 221 may be equal to or greater than the widths 222a of the pattern sections 222.

In some exemplary embodiments, the grooves 221 may be arranged spaced apart from each other by substantially the same interval (pitch). Each of the widths 222a of the pattern sections 222 may correspond to the shortest distance between two adjacent grooves 221. Therefore, the widths 222a of the pattern sections 222 may be substantially the same as each other.

The widths 221a of the grooves 221 may be selected from a range that is suitable to certain conditions. A first condition may relate to a dimension of each of the widths 221a, and a second condition may relate to a ratio of the number of the grooves 221 in the first area 220A1. The widths 221a of the grooves 221 may be selected from a range that is suitable to the two conditions.

According to the first condition, each of the widths 221a of the grooves 221 may be less than about 550 μm. For example, each of the widths 221a of the grooves 221 may be less than about 400 μm or lower. In addition, each of the widths 221a of the grooves 221 may be greater than about 0 μm. According to the second condition, the sum of the widths 221a of the grooves 221 may be less than about 0.23 times of the width 220a of the first area 220A1. Further, the sum of the widths 221a of the grooves 221 may be greater than zero times the width 220a of the first area 220A1.

FIG. 5 shows graphs GP1, GP2, GP3, GP4, and GP5 indicating visibility indices based on the number of the grooves 221 disposed on the first area 220A1 and the widths 221a of the grooves 221. Based on the widths 221a of the grooves 221, a first graph GP1 indicates a visibility index when the number of the grooves 221 is two, a second graph GP2 indicates a visibility index when the number of the grooves 221 is three, a third graph GP2 indicates a visibility index when the number of the grooves 221 is four, a fourth graph GP4 indicates a visibility index when the number of the grooves 221 is five, and a fifth graph GP5 indicates a visibility index when the number of the grooves 221 is six.

The visibility index may be an indicator to determine whether or not a user recognizes the grooves 221 in the first area 220A1. The visibility index may be obtained from combination of contrast sensitivity function (CSF) and Lab color space. Regarding an equation below, the symbol of L is an index to represent the degree of lightness, the symbol +a is an index to represent the degree of red, the symbol of −a is an index to represent the degree of green, the symbol of +b is an index to represent the degree of yellow, and the symbol of −b is an index to represent the degree of blue. A symbol of ΔE denotes a color difference, and is expressed by the equation below.

$$\Delta E = \sqrt{(\Delta L)^2 + (\Delta a^*)^2 + (\Delta b^*)^2}$$

The product of PE and contrast sensitivity function may yield the visibility index. The visibility index may have smaller-is-better characteristics, and thus when the visibility index is less than a specific value, it may be considered that a user does not recognize the grooves 221. The specific value may be about 1. The specific value may be changed based on target goals.

The following Table 1 lists values of graphs illustrated in FIG. 5. In Table 1 below, visibility indices less than 1 are indicated in boldface type.

TABLE 1

| groove width (μm) | number of grooves | | | | |
|---|---|---|---|---|---|
| | 2 | 3 | 4 | 5 | 6 |
| 50 | 0.37 | 0.35 | 0.35 | 0.33 | 0.34 |
| 100 | 0.39 | 0.34 | 0.34 | 0.31 | 0.33 |
| 200 | 0.46 | 0.33 | 0.35 | 0.50 | 0.62 |
| 300 | 0.64 | 0.73 | 0.55 | 0.78 | 1.01 |
| 400 | 0.87 | 0.80 | 0.75 | 1.12 | 1.43 |
| 500 | 1.17 | 1.05 | 0.97 | 1.43 | 1.86 |
| 600 | 1.42 | 1.34 | 1.18 | 1.80 | 2.42 |
| 700 | 1.66 | 1.61 | 1.45 | 2.36 | 3.33 |
| 800 | 1.93 | 1.93 | 1.80 | 3.04 | 4.25 |
| 900 | 2.21 | 2.27 | 2.19 | 3.78 | 5.16 |
| 1000 | 2.49 | 2.58 | 2.68 | 4.46 | 6.13 |

In correspondence to the values listed in Table 1, the following Table 2 shows the percentage ratio of a sum of the widths 221a of the grooves 221 to the width 220a of the first area 220A1. The width 220a of the first area 220A1 is about 8 mm, and Table 2 lists values rounded off to the first digit.

TABLE 2

| groove width (μm) | number of grooves | | | | |
|---|---|---|---|---|---|
| | 2 | 3 | 4 | 5 | 6 |
| 50 | 1% | 2% | 3% | 3% | 4% |
| 100 | 3% | 4% | 5% | 6% | 8% |
| 200 | 5% | 8% | 10% | 13% | 15% |
| 300 | 8% | 11% | 15% | 19% | 23% |
| 400 | 10% | 15% | 20% | 25% | 30% |
| 500 | 13% | 19% | 25% | 31% | 38% |
| 600 | 15% | 23% | 30% | 38% | 45% |
| 700 | 18% | 26% | 35% | 44% | 53% |
| 800 | 20% | 30% | 40% | 50% | 60% |
| 900 | 23% | 34% | 45% | 56% | 68% |
| 1000 | 25% | 38% | 50% | 63% | 75% |

Referring to Tables 1 and 2, when the width 221a of each of the grooves 221 is equal to or less than about 400 μm, and when the ratio of a sum of the widths 221a of the grooves 221 to the width 220a of the first area 220A1 is less than about 23%, a user may not recognize the grooves 221. According to some exemplary embodiments, because the widths 221a of the grooves 221 are selected to satisfy the conditions mentioned above, it may be possible to provide the first protective layer 220 with improved visibility and folding characteristics. As a result, the display device 1000 of FIG. 1A may have improved product reliability.

The second adhesive layer 230 may be attached to the top surface 220-U of the first protective layer 220.

The second protective layer 240 may be disposed on and attached to the second adhesive layer 230. The second protective layer 240 may include a synthetic resin film, for example, a polyimide film. The second protective layer 240 may be a single layer, but exemplary embodiments are not limited thereto. For example, the second protective layer 240 may include two or more films coupled to each other through an adhesive layer. Alternatively, in some exemplary embodiments, the second protective layer 240 may be an ultra-thin-film tempered glass.

The functional coating layer 250 may be disposed on the second protective layer 240. The functional coating layer 250 may include one or more of an anti-fingerprint layer, an antireflective layer, and a hard coating layer.

Figure 6A:
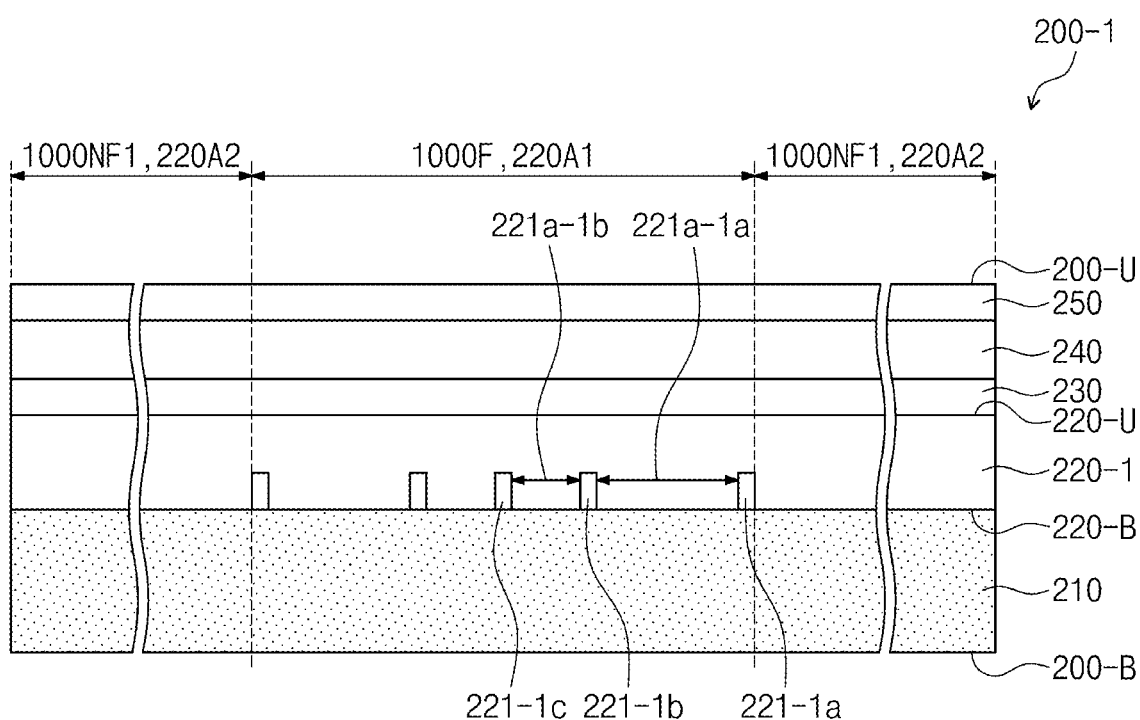
FIG. 6A is a cross-sectional view of another exemplary embodiment of the upper layer of FIG. 2.

FIG. 6A is a cross-sectional view of another exemplary embodiment of the upper layer of FIG.

Referring to FIG. 6A, an upper layer 200-1 may include a first adhesive layer 210, a first protective layer 220-1, a second adhesive layer 230, a second protective layer 240, and a functional coating layer 250 that are sequentially stacked along the third direction DR3.

To improve folding characteristics of the first protective layer 220-1, a plurality of grooves 221-1a, 221-1b, and 221-1c may be formed in the first protective layer 220-1. The plurality of grooves 221-1a, 221-1b, and 221-1c may be spaced apart from each other in the first direction DR1. For example, the plurality of grooves 221-1a, 221-1b, and 221-1c may be spaced apart from each other by different intervals.

The plurality of grooves 221-1a, 221-1b, and 221-1c may include a first groove 221-1a, a second groove 221-1b, and a third groove 221-1c that are sequentially arranged in a direction away from the second area 220A2 disposed on the right side of FIG. 6A. An interval 221a-1a between the first groove 221-1a and the second groove 221-1b may be greater than an interval 221a-1b between the second groove 221-1b and the third groove 221-1c. For example, the intervals among the grooves 221-1a, 221-1b, and 221-1c may increase in a direction approaching an edge of the right one of the first areas 220A1 from a center of the first area 220A1.

Figure 6B:
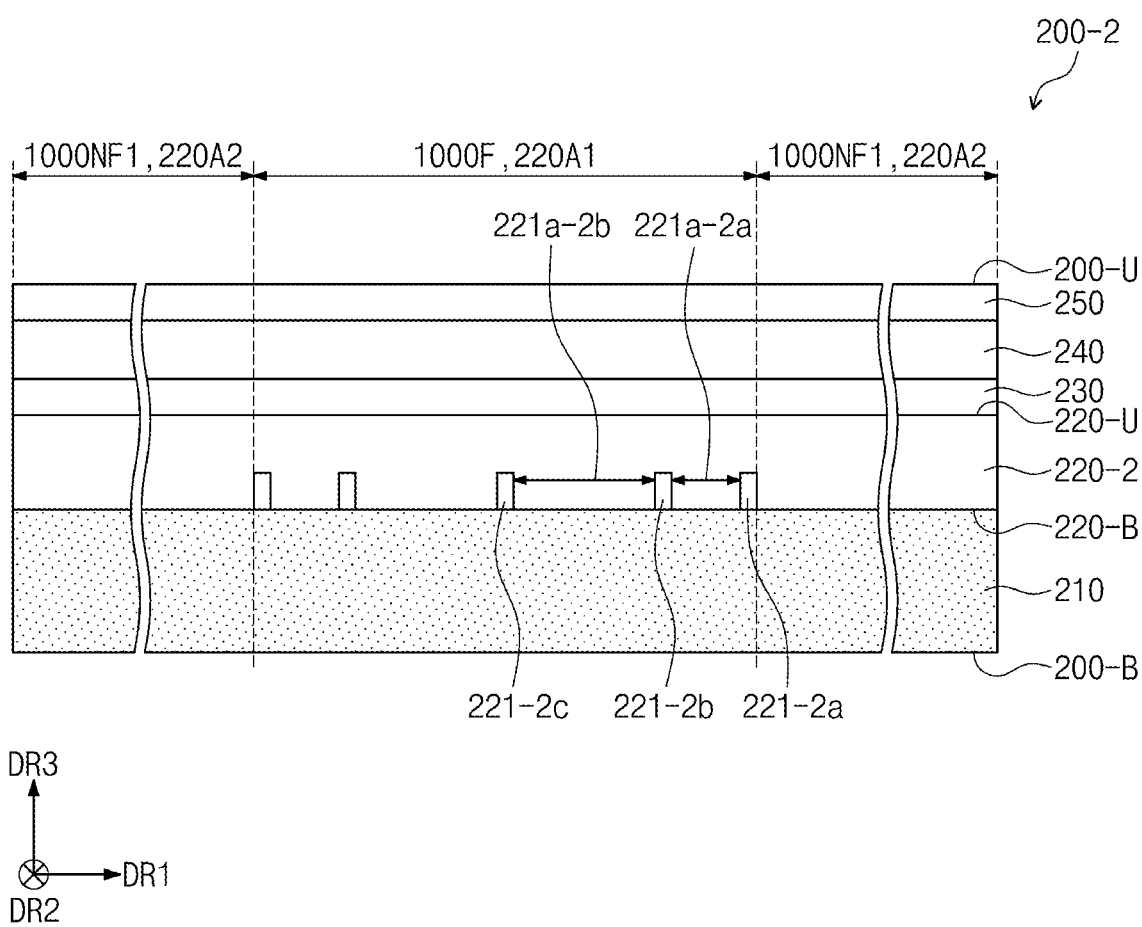
FIG. 6B is a cross-sectional view of another exemplary embodiment of the upper layer of FIG. 2.

FIG. 6B is a cross-sectional view of another exemplary embodiment of the upper layer of FIG. 2.

Referring to FIG. 6B, an upper layer 200-2 may include a first adhesive layer 210, a first protective layer 220-2, a second adhesive layer 230, a second protective layer 240, and a functional coating layer 250 that are sequentially stacked along the third direction DR3.

To improve folding characteristics of the first protective layer 220-2, a plurality of grooves 221-2a, 221-2b, and 221-2c may be formed in the first protective layer 220-2. The plurality of grooves 221-2a, 221-2b, and 221-2c may be spaced apart from each other in the first direction DR1. The plurality of grooves 221-2a, 221-2b, and 221-2c may be spaced apart from each other by different intervals.

The plurality of grooves 221-2a, 221-2b, and 221-2c may include a first groove 221-2a, a second groove 221-2b, and a third groove 221-2c that are sequentially arranged in a direction away from the right one of the second areas 220A2. An interval 221a-2a between the first groove 221-2a and the second groove 221-2b may be less than an interval 221a-2b between the second groove 221-2b and the third groove 221-2c. For example, the intervals among the grooves 221-2a, 221-2b, and 221-2c may decrease in a direction approaching the edge of the right one of the first areas 220A1 from a center of the first area 220A1.

Figure 7A:
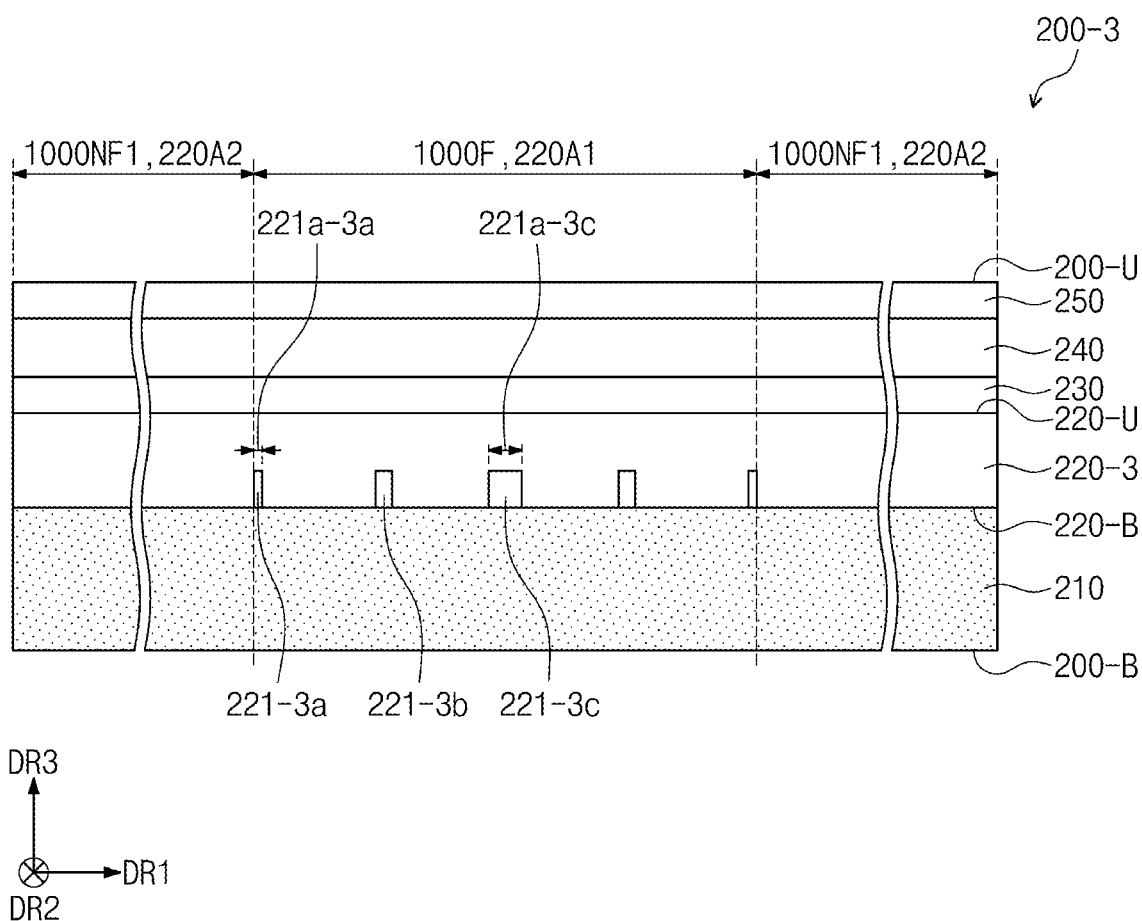
FIG. 7A is a cross-sectional view of another exemplary embodiment of the upper layer of FIG. 2.

FIG. 7A is a cross-sectional view of another exemplary embodiment of the upper layer of FIG. 2.

Referring to FIG. 7A, an upper layer 200-3 may include a first adhesive layer 210, a first protective layer 220-3, a second adhesive layer 230, a second protective layer 240, and a functional coating layer 250 that are sequentially stacked along the third direction DR3.

To improve folding characteristics of the first protective layer 220-3, a plurality of grooves 221-3a, 221-3b, and 221-3c may be formed in the first protective layer 220-3. The plurality of grooves 221-3a, 221-3b, and 221-3c may be spaced apart from each other in the first direction DR1.

The plurality of grooves 221-3a, 221-3b, and 221-3c may include a first groove 221-3a, a second groove 221-3b, and a third groove 221-3c that are sequentially arranged in a direction away from the left one of the second areas 220A2. The first groove 221-3a, the second groove 221-3b, and the third groove 221-3c may have different widths from each other. For example, a width 221a-3a of the first groove 221-3a may be less than a width 221a-3c of the third groove 221-3c. In some exemplary embodiments, widths of the plurality of grooves 221-3a, 221-3b, and 221-3c may decrease in a direction approaching an edge of the left one of the second areas 220A2 from a center of the first area 220A1.

Figure 7B:
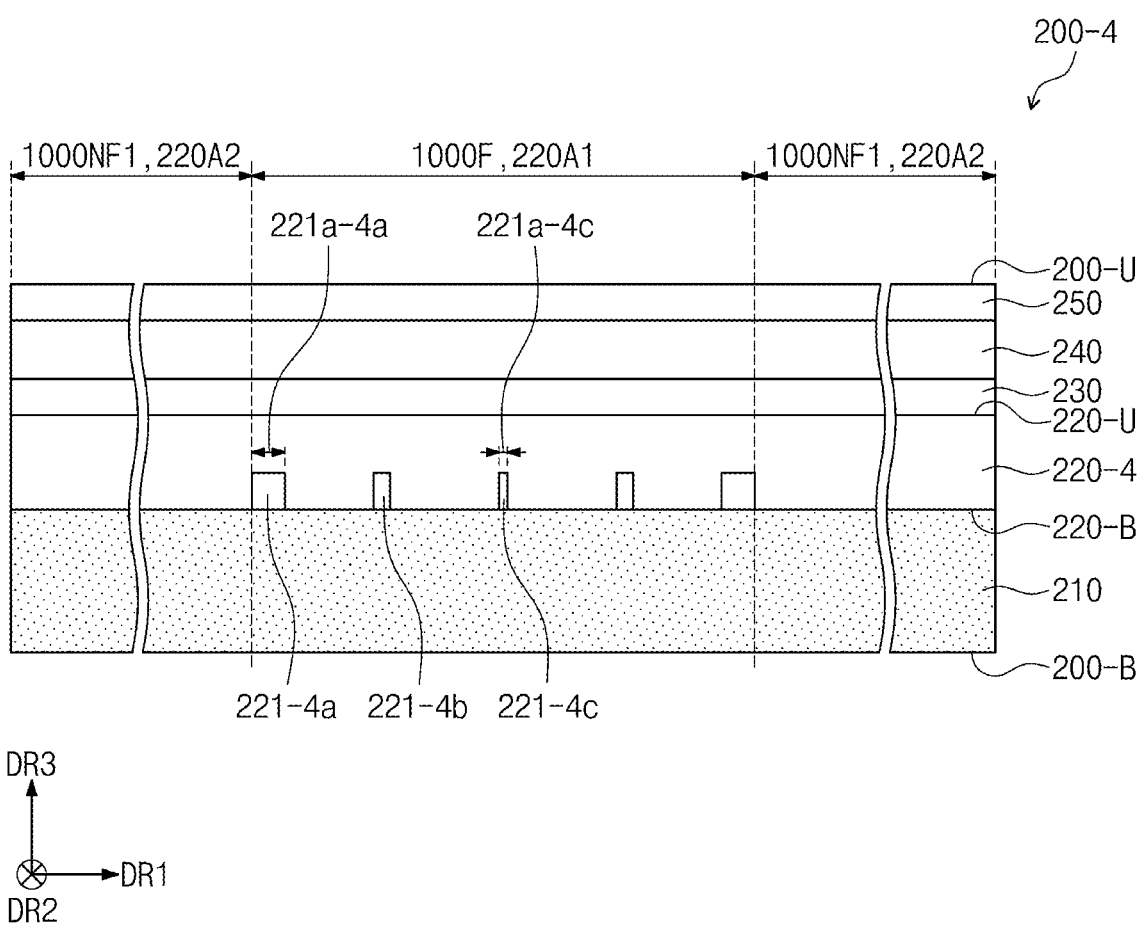
FIG. 7B is a cross-sectional view of another exemplary embodiment of the upper layer of FIG. 2.

FIG. 7B is a cross-sectional view of another exemplary embodiment of the upper layer of FIG. 2.

Referring to FIG. 7B, an upper layer 200-4 may include a first adhesive layer 210, a first protective layer 220-4, a second adhesive layer 230, a second protective layer 240, and a functional coating layer 250 that are sequentially stacked along the third direction DR3.

To improve folding characteristics of the first protective layer 220-4, a plurality of grooves 221-4a, 221-4b, and 221-4c may be formed in the first protective layer 220-4. The plurality of grooves 221-4a, 221-4b, and 221-4c may be spaced apart from each other in the first direction DR1.

The plurality of grooves 221-4a, 221-4b, and 221-4c may include a first groove 221-4a, a second groove 221-4b, and a third groove 221-4c that are sequentially arranged in a direction away from the left one of the second areas 220A2. The first groove 221-4a, the second groove 221-4b, and the third groove 221-4c may have different widths from each other. For example, a width 221a-4a of the first groove 221-4a may be greater than a width 221a-4c of the third groove 221-4c. In some exemplary embodiments, widths of the plurality of grooves 221-4a, 221-4b, and 221-4c may increase in a direction approaching the edge of the left one of the second areas 220A2 from a center of the first area 220A1.

FIGS. 7A and 7B show that widths of the plurality of grooves may be gradually changed in a direction approaching an edge from a center of the first area 220A1, but exemplary embodiments are not limited thereto. For example, the widths of the plurality of grooves may have randomized sizes.

FIG. 8 is a cross-sectional view of another exemplary embodiment of the upper layer of FIG. 2.

Referring to FIG. 8, an upper layer 200-5 may include a first adhesive layer 210, a first protective layer 220-5, a second adhesive layer 230, a second protective layer 240, and a functional coating layer 250 that are sequentially stacked along the third direction DR3.

To improve folding characteristics of the first protective layer 220-5, a plurality of grooves 221-5 may be formed in the first protective layer 220-5.

Although the grooves illustrated above in FIGS. 4, 6A, 6B, 7A, and 7B have generally tetragonal shapes when viewed in plan, the plurality of grooves 221-5 shown in FIG. 8 may have generally trapezoidal or other shapes. The grooves illustrated above in FIGS. 4, 6A, 6B, 7A, and 7B may be changed to trapezoidal or other shapes. To prevent the grooves 221-5 from being recognized, at least one of the plurality of grooves 221-5 may have a tetragonal shape, and another one of the plurality of grooves 221-5 may have a trapezoidal shape.

FIG. 9 is a cross-sectional view of another exemplary embodiment of the upper layer of FIG. 2.

Referring to FIG. 9, an upper layer 200-6 may include a first adhesive layer 210, a first protective layer 220-6, a second adhesive layer 230, a second protective layer 240, and a functional coating layer 250 that are sequentially stacked along the third direction DR3.

To improve folding characteristics of the first protective layer 220-6, a plurality of grooves 221-6 may be formed in the first protective layer 220-6. Each of the plurality of grooves 221-6 may have a generally lenticular shape with curvature.

Figure 10:
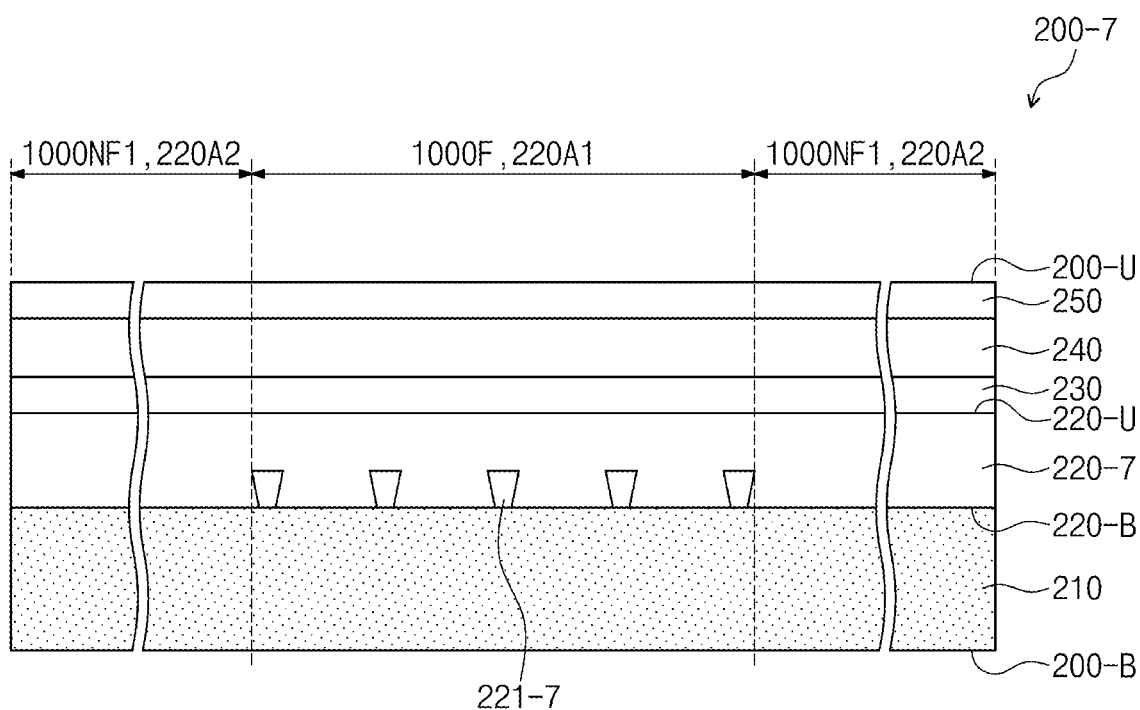
FIG. 10 is a cross-sectional view of another exemplary embodiment of the upper layer of FIG. 2.

FIG. 10 is a cross-sectional view of another exemplary embodiment of the upper layer of FIG. 2.

Referring to FIG. 10, an upper layer 200-7 may include a first adhesive layer 210, a first protective layer 220-7, a second adhesive layer 230, a second protective layer 240, and a functional coating layer 250 that are sequentially stacked along the third direction DR3.

To improve folding characteristics of the first protective layer 220-7, a plurality of grooves 221-7 may be formed in the first protective layer 220-7. Each of the plurality of grooves 221-7 may have a generally inverse trapezoidal shape.

Figure 11:
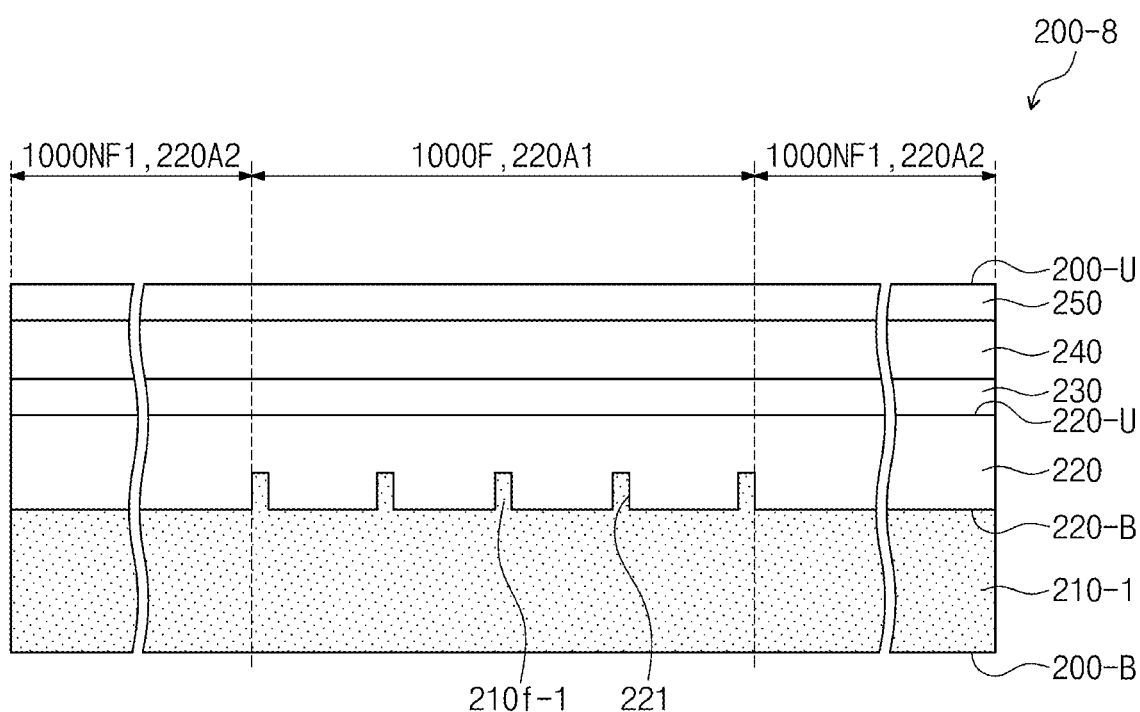
FIG. 11 is a cross-sectional view of another exemplary embodiment of the upper layer of FIG. 2.

FIG. 11 is a cross-sectional view of another exemplary embodiment of the upper layer of FIG. 2.

Referring to FIG. 11, an upper layer 200-8 may include a first adhesive layer 210-1, a first protective layer 220, a second adhesive layer 230, a second protective layer 240, and a functional coating layer 250 that are sequentially stacked along the third direction DR3.

The first adhesive layer 210-1 may include protrusions 210f-1 that protrude in an upward direction toward the first protective layer 220. The protrusions 210f-1 may be accommodated in grooves 221 provided in the first protective layer 220.

The difference in refractive index between the first protective layer 220 and the protrusions 210f-1 may be less than the difference in refractive index between air and the first protective layer. Therefore, the reflectance of external light may be reduced by decreasing the difference in the refractive index between the first protective layer 220 and the protrusions 210f-1. Accordingly, a user may not easily recognize the grooves 221.

Figure 12:
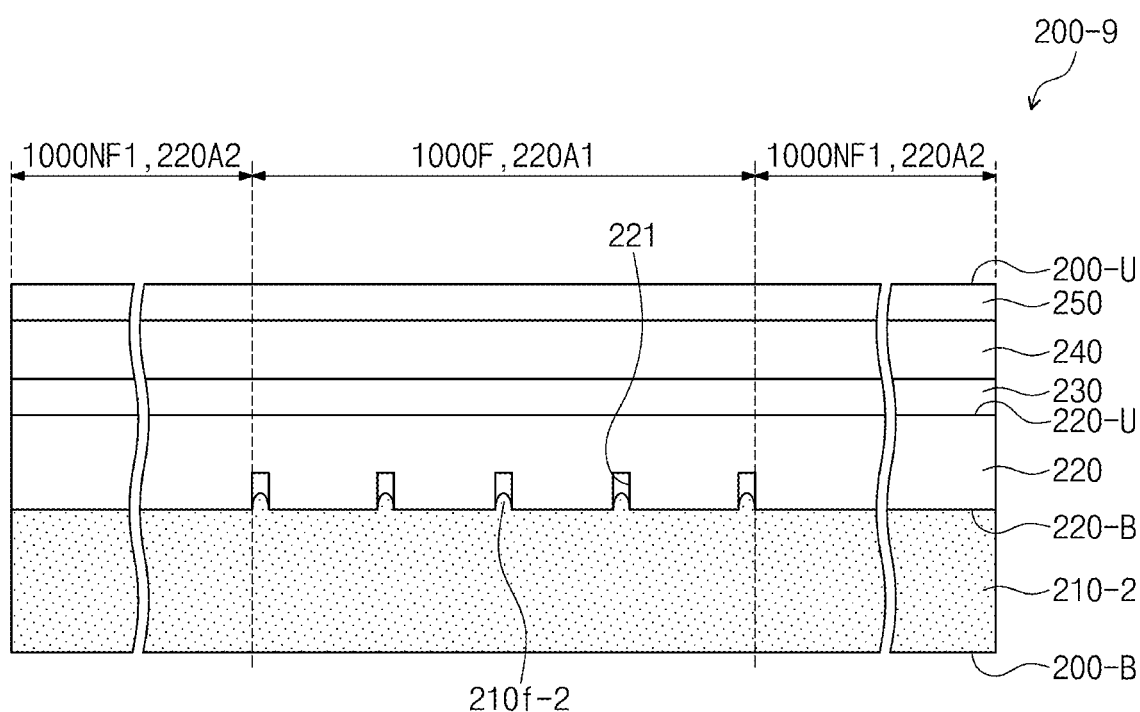
FIG. 12 is a cross-sectional view of another exemplary embodiment of the upper layer of FIG. 2.

FIG. 12 is a cross-sectional view of another exemplary embodiment of the upper layer of FIG. 2.

Referring to FIG. 12, an upper layer 200-9 may include a first adhesive layer 210-2, a first protective layer 220, a second adhesive layer 230, a second protective layer 240, and a functional coating layer 250 that are sequentially stacked along the third direction DR3.

The first adhesive layer 210-2 may include protrusions 210f-2 that protrude upwardly in a direction toward the first protective layer 220. The protrusions 210f-2 may be accommodated in grooves 221 provided on the first protective layer 220. The protrusion 210f-2 may be accommodated in a portion of each of the grooves 221, and air is disposed in another portion of each of the grooves 221. For example, the protrusions 210f-2 may partially fill each of the grooves 221 of the first protective layer 220.

Figure 13:
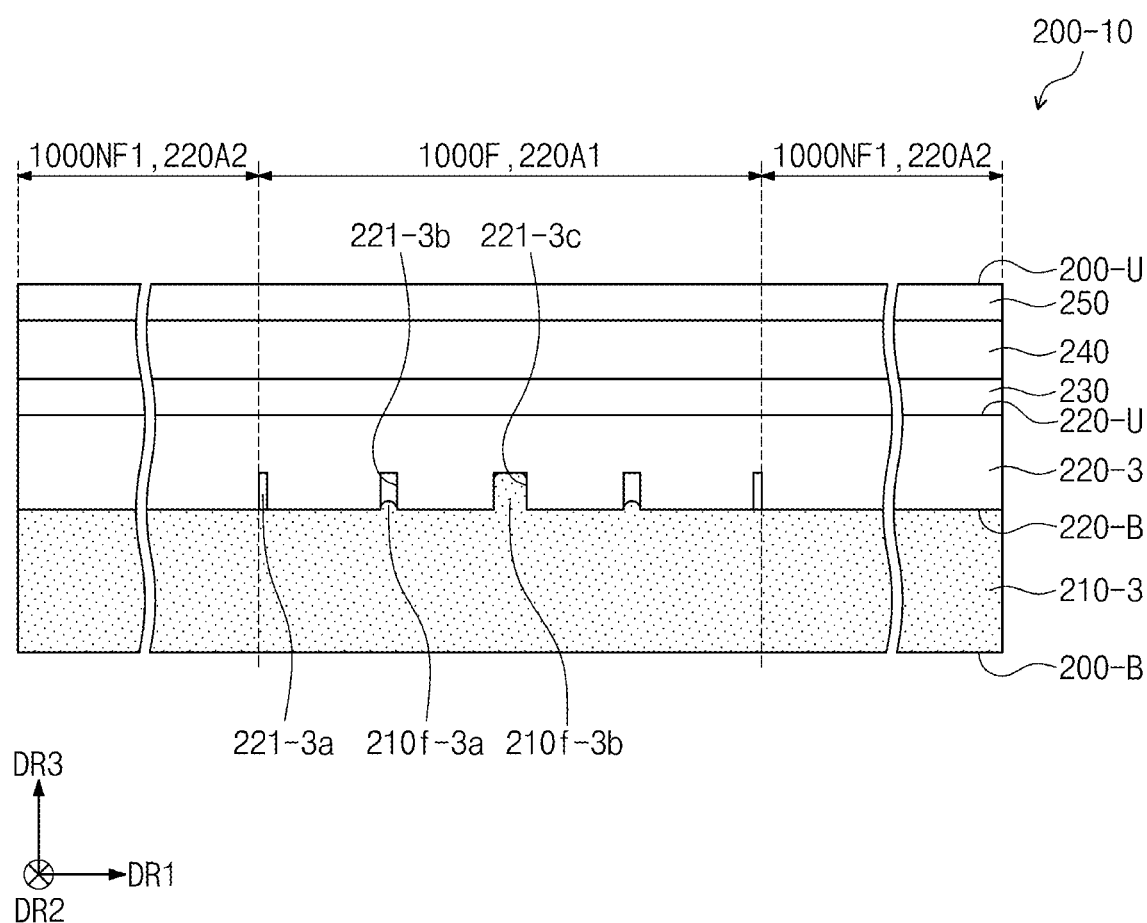
FIG. 13 is a cross-sectional view of another exemplary embodiment of the upper layer of FIG. 2.

FIG. 13 is a cross-sectional view of another exemplary embodiment of the upper layer of FIG. 2.

Referring to FIG. 13, an upper layer 200-10 may include a first adhesive layer 210-3, a first protective layer 220-3, a second adhesive layer 230, a second protective layer 240, and a functional coating layer 250 that are sequentially stacked along the third direction DR3.

The first adhesive layer 210-3 may include protrusions 210f-3a and 210f-3b that protrude in an upward direction toward the first protective layer 220-3. The protrusions 210f-3a and 210f-3b may be accommodated in ones of grooves 221-3a, 221-3b, and 221-3c that are provided on the first protective layer 220-3. For example, the protrusions 210f-3a and 210f-3b may be accommodated in grooves 221-3b and 221-3c whose sizes are relatively large. For example, the protrusion 210f-3a may partially fill the groove 221-3b of the first protective layer 220-3, and the protrusion 210f-3c may completely fill the groove 221-3b of the first protective layer 220-3. Further, the groove 221-3a of the first protective layer 220-3 may not be filled with the first adhesive layer 210-3.

Figure 14:
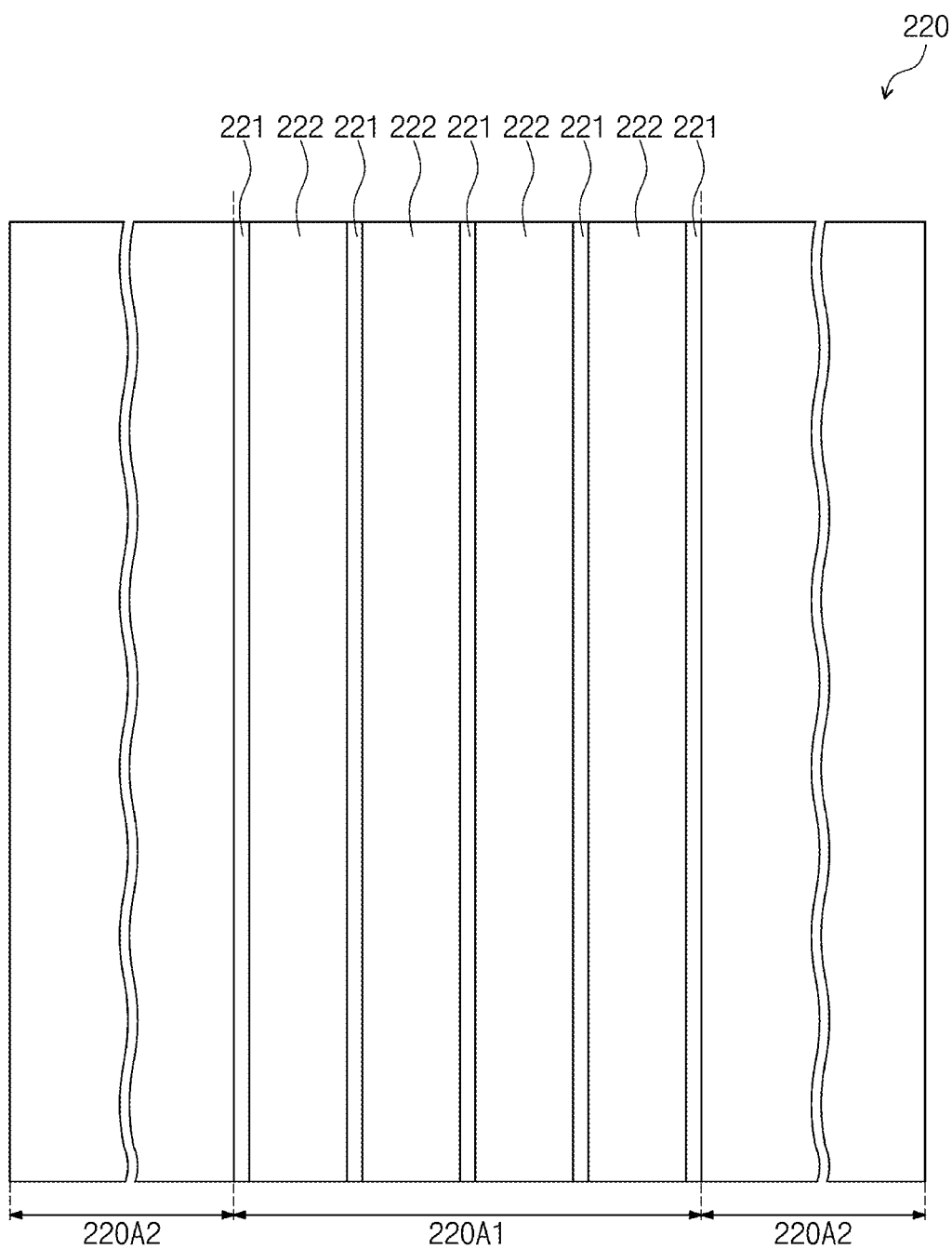
FIG. 14 is a plan view of an exemplary embodiment of a protective layer of the upper layer of FIG. 2.

FIG. 14 is a plan view of an exemplary embodiment of a protective layer of the upper layer of FIG. 2.

Referring to FIGS. 4 and 14, the plan view illustrates a first protective layer 220. As discussed above, a plurality of grooves 221 may be formed in the first protective layer 220. The plurality of grooves 221 may be spaced apart from each other in the first direction DR1, and each of the plurality of grooves 221 may extend along the second direction DR2 intersecting the first direction DR1. The second direction DR2 may correspond to an extending longitudinal direction of the foldable area 1000F of FIG. 1A. In addition, the grooves described with reference to FIGS. 6A, 6B, 7A, 7B, 8, 9, 10, 11, 12, and 13 are illustrated in a plan view in FIG. 14.

Figure 15:
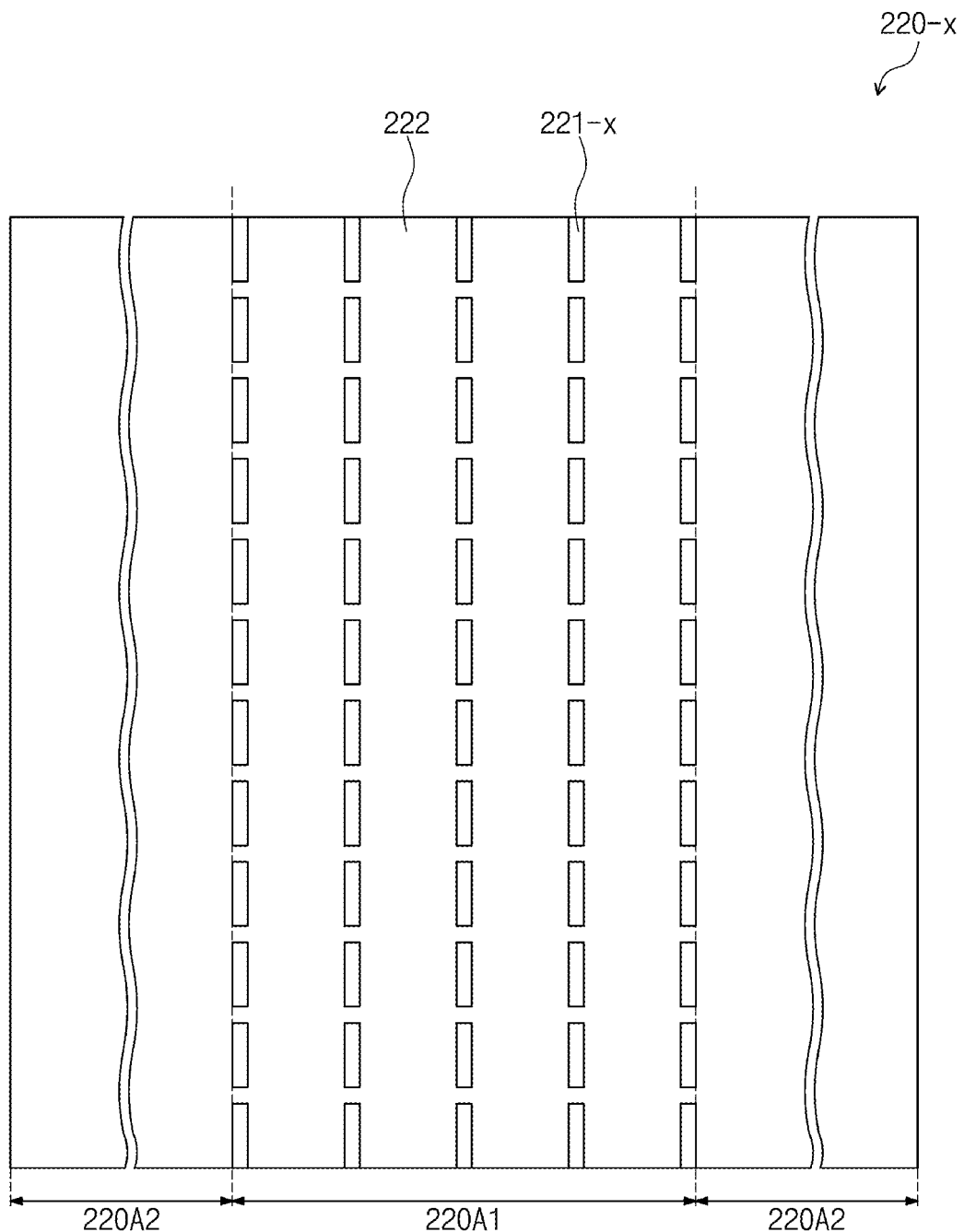
FIG. 15 is a plan view of another exemplary embodiment of the protective layer of the upper layer of FIG. 2.

FIG. 15 is a plan view of another exemplary embodiment of the protective layer of the upper layer of FIG. 2.

Referring to FIG. 15, a plan view illustrates a first protective layer 220-x. A plurality of grooves 221-x may be formed in the first protective layer 220-x. The plurality of grooves 221-x may be arranged spaced apart from each other in the first direction DR1 and the second direction DR2.

FIG. 15 differs from the embodiment of FIG. 14 in that each line of grooves 221-x is made up of individual grooves that are not continuous as with the grooves 221 in the FIG. 14 embodiment, but made up of a plurality of grooves spaced apart from each other in the second direction DR2. FIG. 15 illustrates an exemplary embodiment where the plurality of grooves 221-x have substantially the same length in the second direction DR2, but exemplary embodiments are not limited thereto. In another exemplary embodiment, the plurality of grooves 221-x may have different lengths in the second direction DR2.

In addition, the grooves described with reference to FIGS. 6A, 6B, 7A, 7B, 8, 9, 10, 11, 12, and 13 are illustrated in a plan view in FIG. 15.

Figure 16:
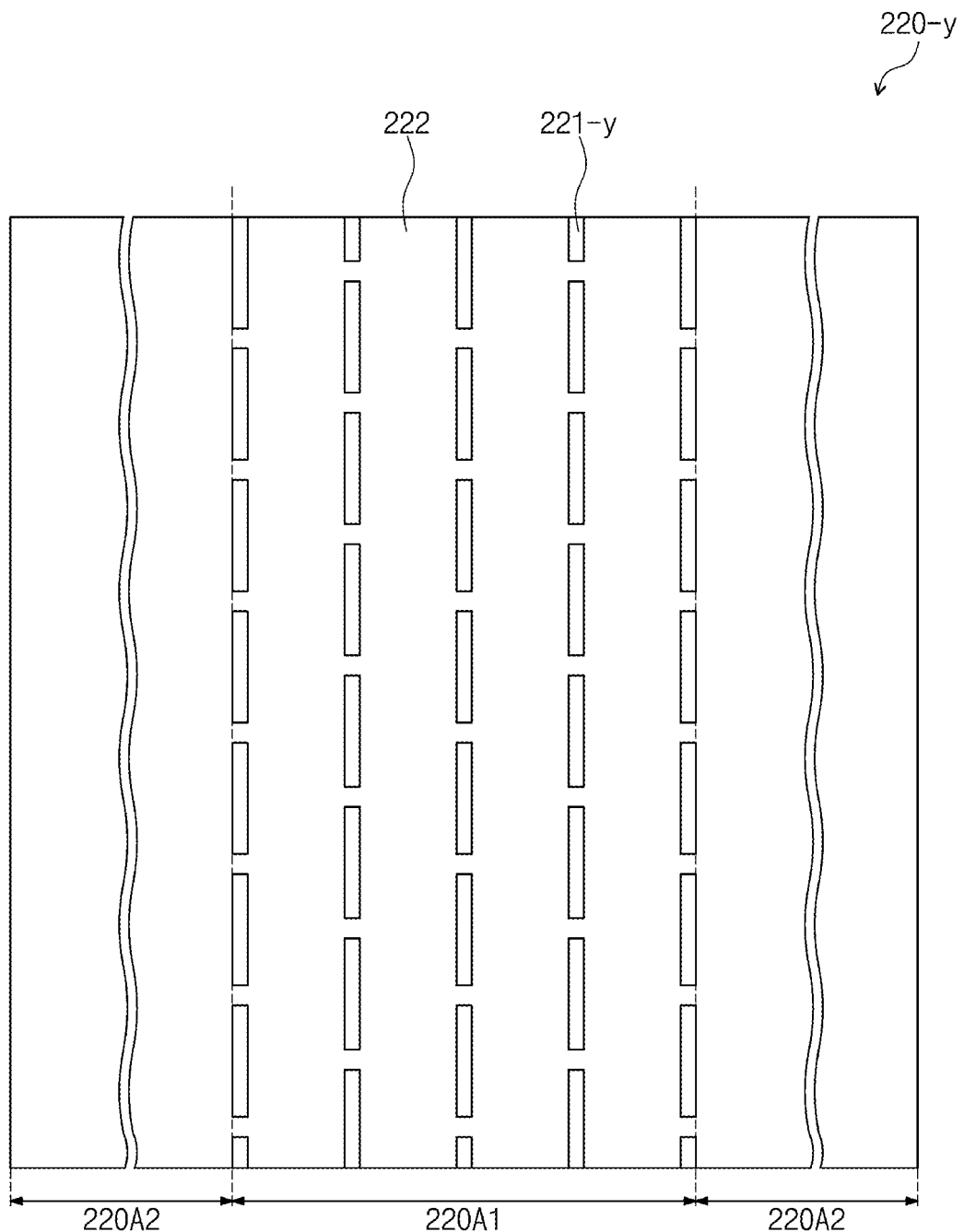
FIG. 16 is a plan view of another exemplary embodiment of the protective layer of the upper layer of FIG. 2.

FIG. 16 is a plan view of another exemplary embodiment of the protective layer of the upper layer of FIG. 2.

Referring to FIG. 16, a plan view illustrates a first protective layer 220-y. A plurality of grooves 221-y may be formed in the first protective layer 220-y. The plurality of grooves 221-y may be arranged spaced apart from each other in the first direction DR1 and the second direction DR2. The plurality of grooves 221-y may have two grooves that are spaced apart from each other in the second direction DR2, and when viewed in the first direction DR1, a space between the two grooves may overlap another groove. In other words, FIG. 16 differs from the embodiment of FIG. 15 in that the individual grooves 221-y of adjacent lines of grooves are offset from each other in the second direction DR2.

In addition, the grooves described with reference to FIGS. 6A, 6B, 7A, 7B, 8, 9, 10, 11, 12, and 13 may be illustrated in a plan view in FIG. 16.

Figure 17:
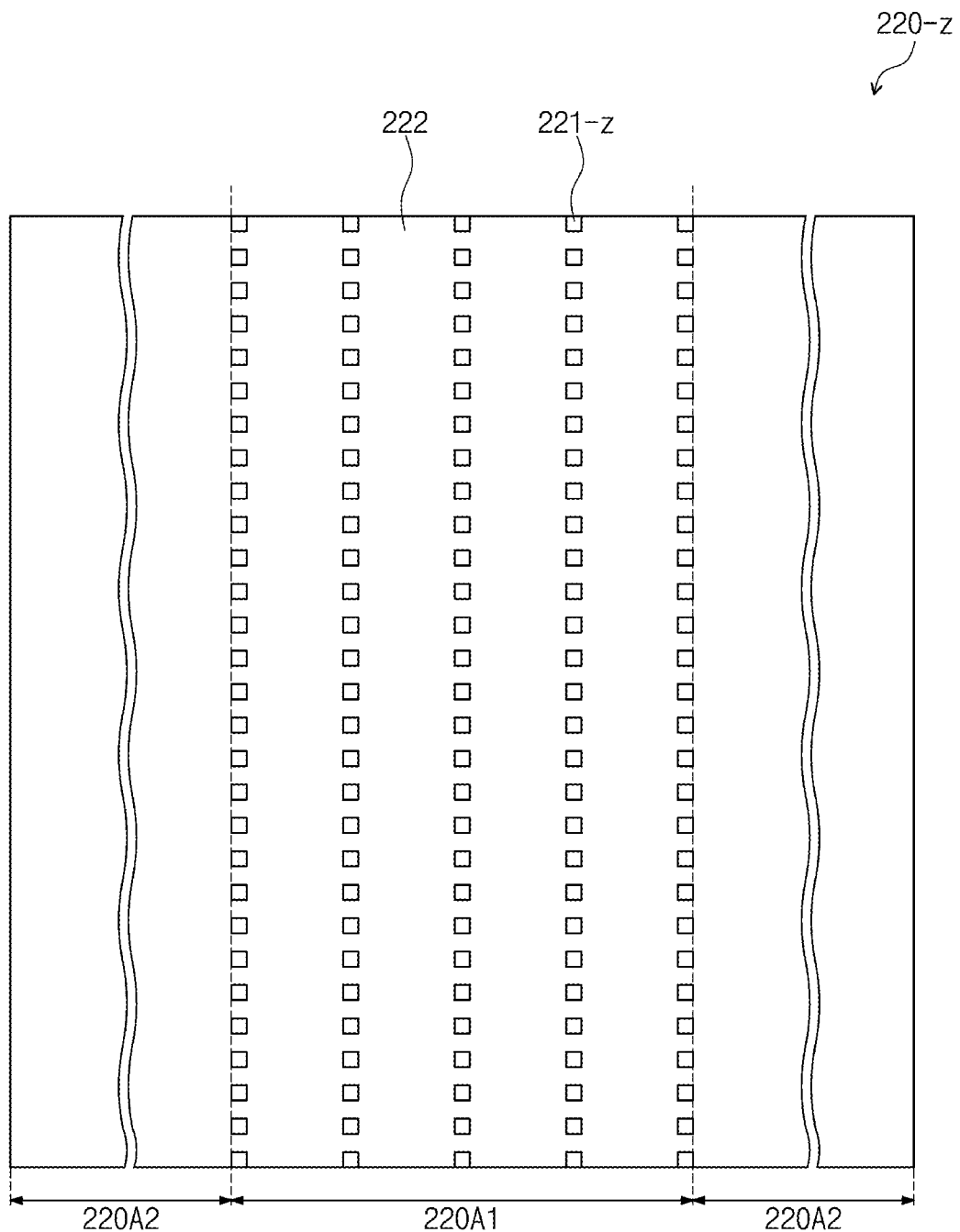
FIG. 17 is a plan view of another exemplary embodiment of the protective layer of the upper layer of FIG. 2.

FIG. 17 is a plan view of another exemplary embodiment of the protective layer of the upper layer of FIG. 2.

Referring to FIG. 17, a plan view illustrates a first protective layer 220-z. A plurality of grooves 221-z may be formed in the first protective layer 220-z. Each of the grooves 221-z may be provided in the form of a dot. For example, each of the grooves 221-z may have a substantially square shape, a substantially circular shape, or a substantially polygonal shape when viewed in plan. The plurality of grooves 221-z may be arranged along the first direction DR1 and the second direction DR2. In addition, the grooves described with reference to FIGS. 6A, 6B, 7A, 7B, 8, 9, 10, 11, 12, and 13 may be illustrated in a plan view in FIG. 17.

Figure 18:
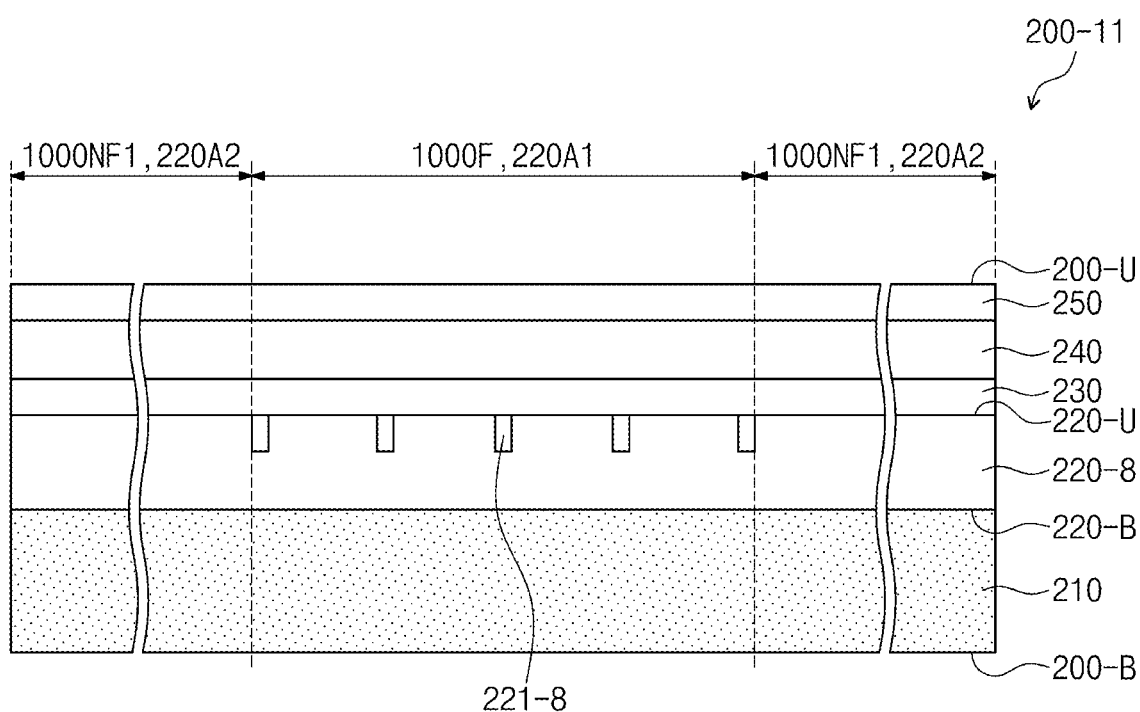
FIG. 18 is a cross-sectional view of another exemplary embodiment of the upper layer of FIG. 2.

FIG. 18 is a cross-sectional view of another exemplary embodiment of the upper layer of FIG. 2.

Referring to FIG. 18, an upper layer 200-11 may include a first adhesive layer 210, a first protective layer 220-8, a second adhesive layer 230, a second protective layer 240, and a functional coating layer 250 that are sequentially stacked along the third direction DR3.

To improve folding characteristics of the first protective layer 220-8, a plurality of grooves 221-8 may be formed in the first protective layer 220-8. The grooves 221-8 may be spaced apart from each other in the first direction DR1, and may be recessed downwardly from the top surface 220-U toward the bottom surface 220-B.

Figure 19:
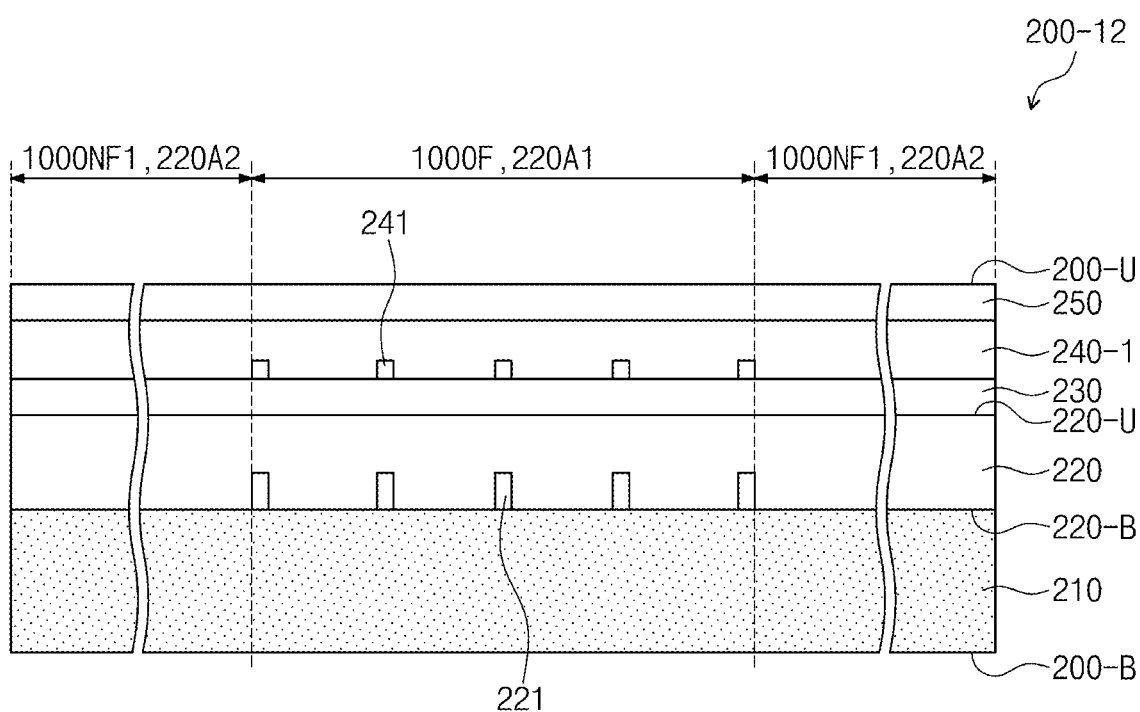
FIG. 19 is a cross-sectional view of another exemplary embodiment of the upper layer of FIG. 2.

FIG. 19 is a cross-sectional view of another exemplary embodiment of the upper layer of FIG. 2.

Referring to FIG. 19, an upper layer 200-12 may include a first adhesive layer 210, a first protective layer 220, a second adhesive layer 230, a second protective layer 240-1, and a functional coating layer 250 that are sequentially stacked along the third direction DR3.

To improve folding characteristics of the second protective layer 240-1, a plurality of grooves 241 may also be formed in the second protective layer 240-1. The grooves 241 may be spaced apart from each other in the first direction DR1.

FIG. 20 is a cross-sectional view of another exemplary embodiment of the upper layer of FIG. 2.

Referring to FIG. 20, an upper layer 200-13 may include a first adhesive layer 210, a first protective layer 220-9, a second adhesive layer 230, a second protective layer 240-1, and a functional coating layer 250 that are sequentially stacked along the third direction DR3.

No groove may be formed in the first protective layer 220-9, and a plurality of grooves 241 may be selectively formed in the second protective layer 240-1 to improve folding characteristics of the second protective layer 240-1.

Figure 21:
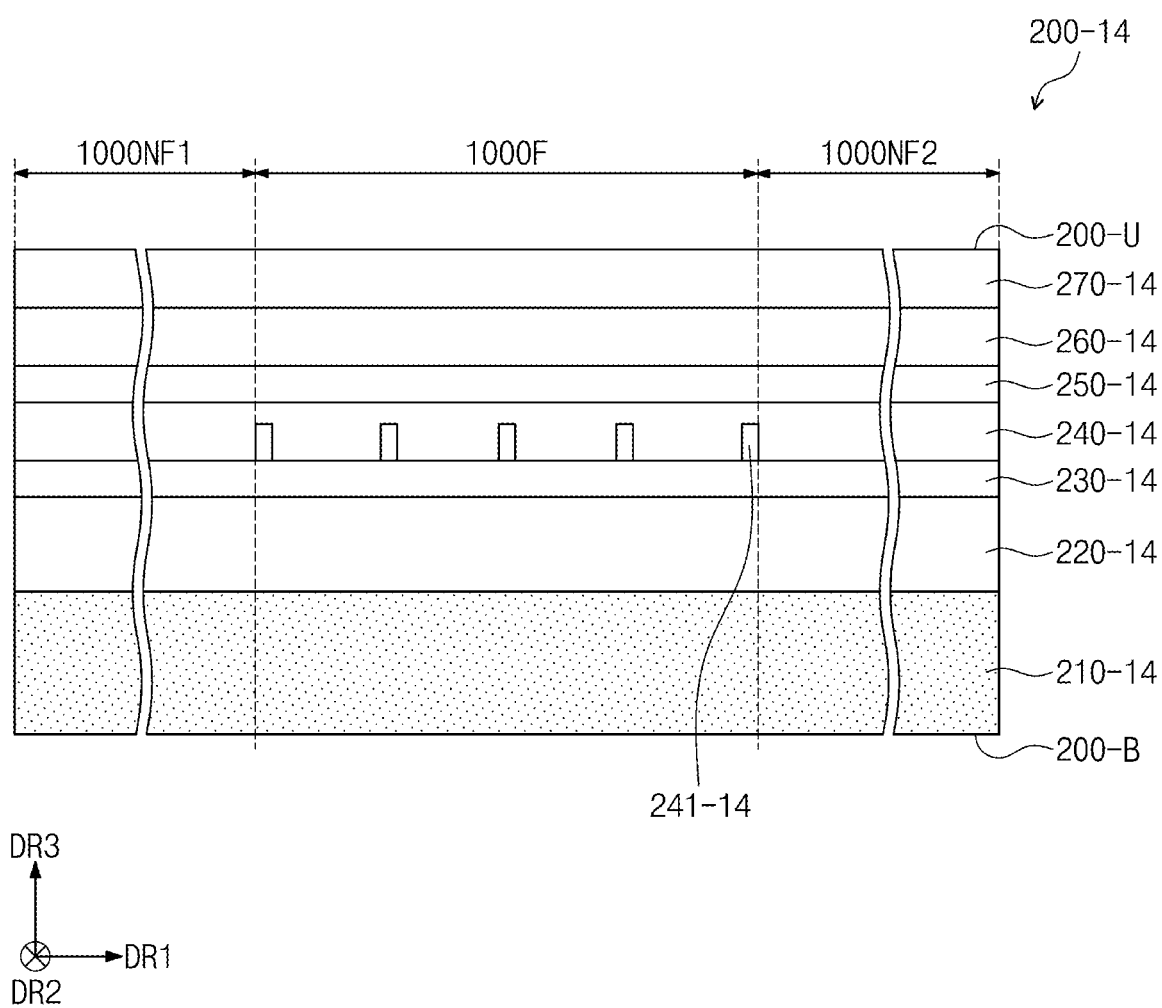
FIG. 21 is a cross-sectional view of another exemplary embodiment of the upper layer of FIG. 2.

FIG. 21 is a cross-sectional view of another exemplary embodiment of the upper layer of FIG. 2.

Referring to FIG. 21, an upper layer 200-14 may include a first adhesive layer 210-14, an anti-reflective layer 220-14, a second adhesive layer 230-14, a first protective layer 240-14, a functional coating layer 250-14, a third adhesive layer 260-14, and a second protective layer 270-14.

The anti-reflective layer 220-14 may reduce reflectance of external light incident from the outside. The anti-reflective layer 220-14 may include a retarder and a polarizer. Alternatively, the anti-reflective layer 220-14 may include color filters. In another exemplary embodiment, the anti-reflective layer 220-14 may include a destructive interference structure.

Each of the first and second protective layers 240-14 and 270-14 may be an ultra-thin-film tempered glass or a synthetic resin film. For example, the first protective layer 240-14 may be an ultra-thin-film tempered glass, and the second protective layer 270-14 may be a synthetic resin film. The first protective layer 240-14 may be a window, and the second protective layer 270-14 may be a protective film.

Grooves may be provided on one or more of the first and second protective layers 240-14 and 270-14. For example, grooves 241-14 may be provided on the first protective layer 240-14. The grooves 241-14 may be provided on the foldable area 1000F, and may improve folding characteristics of the upper layer 200-14. In some exemplary embodiments, the grooves 241-14 may also be additionally provided on the second protective layer 270-14 or the antireflective layer 220-14.

According to some exemplary embodiments, a plurality of grooves provided on a protective layer may improve folding characteristics of a display device. Moreover, a plurality of grooves may not be externally recognized by adjusting a ratio of a sum of widths of the plurality of grooves to a width of a foldable area and by adjusting the width of each of the plurality of grooves.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a display module; and
a layer disposed on the display module and having a first area and a second area adjacent to the first area, the layer in the first area including a plurality of discontinuities spaced apart from each other, wherein
widths of the plurality of discontinuities and a width of the first area are substantially parallel to a first direction,
wherein the plurality of discontinuities include a first discontinuity, a second discontinuity, and a third discontinuity that are sequentially arranged along the first direction, and
wherein a distance between the first discontinuity and the second discontinuity is different from a distance between the second discontinuity and the third discontinuity.

2. The display device of claim 1, wherein the layer includes a bottom surface facing the display module and a top surface spaced apart from the display module,
wherein each of the plurality of discontinuities is recessed from the bottom surface in a direction toward the top surface.

3. The display device of claim 1, wherein the layer includes a bottom surface facing the display module and a top surface spaced apart from the display module,
wherein each of the plurality of discontinuities is recessed from the top surface in a direction toward the bottom surface.

4. The display device of claim 1, wherein the plurality of discontinuities are spaced apart from each other by substantially the same interval.

5. The display device of claim 1, wherein, when viewed in cross-section, each of the plurality of discontinuities comprises a groove having a substantially square shape, a substantially trapezoidal shape, a substantially inverse trapezoidal shape, or a substantially lenticular shape.

6. The display device of claim 1, wherein the plurality of discontinuities comprises a plurality of grooves and air is disposed in at least a portion of the plurality of grooves.

7. The display device of claim 1, further comprising an adhesive attached to the layer,
wherein a portion of the adhesive is disposed in at least a portion of the plurality of discontinuities.

8. The display device of claim 1, wherein the plurality of discontinuities comprises a plurality of grooves and the display device further comprises an adhesive attached to the layer, wherein air is disposed in a portion of each of the plurality of grooves, and wherein a portion of the adhesive is disposed in another portion of each of the plurality of grooves.

9. The display device of claim 1, wherein each of the plurality of discontinuities has a width less than an interval between two adjacent discontinuities.

10. The display device of claim 1, wherein the plurality of discontinuities comprises a plurality of grooves and each of the plurality of grooves has a depth less than a thickness of the layer.

11. The display device of claim 1, wherein the layer comprises a protective layer including a tempered glass or a synthetic resin film.

12. The display device of claim 1, wherein:

the plurality of discontinuities are spaced apart from each other in the first direction, and each of the plurality of discontinuities extends in a second direction intersecting the first direction.

13. The display device of claim 1, wherein the plurality of discontinuities are spaced apart from each other in the first direction and a second direction intersecting the first direction.

14. A display device comprising:

a display module; and a layer disposed on the display module and having a first area and a second area adjacent to the first area, the layer in the first area including a plurality of discontinuities spaced apart from each other, wherein widths of the plurality of discontinuities and a width of the first area are substantially parallel to a first direction, wherein the plurality of discontinuities include a first discontinuity and a second discontinuity that are spaced apart from each other along the first direction, and wherein a width substantially parallel to the first direction of the first discontinuity is different from a width substantially parallel to the first direction of the second discontinuity.

15. A display device comprising:

a display module; and a window disposed on the display module, the window including a bottom surface facing the display module and a top surface spaced apart from the display module, wherein the window includes a plurality of discontinuities in the bottom surface that are spaced apart from each other along a first direction, and wherein:

the plurality of discontinuities comprise a plurality of grooves recessed in a direction extending from the bottom surface to the top surface, and wherein each of the plurality of grooves has a depth less than a thickness of the window.

16. The display device of claim 15, wherein the window comprises a first area overlapping the plurality of discontinuities and a second area adjacent to the first area, wherein a boundary between the first area and the second area overlaps a sidewall of an outermost one of the plurality of discontinuities, and wherein a sum of widths of the plurality of discontinuities is less than about 0.23 times of a width of the first area and greater than about zero times of the width of the first area, the widths of the plurality of discontinuities and the width of the first area being substantially parallel to the first direction.

17. The display device of claim 15, wherein each of the plurality of discontinuities has a width greater than zero μm and equal to or less than about 400 μm.

18. The display device of claim 15, wherein each of the plurality of discontinuities has a width less than an interval between two adjacent discontinuities.

19. The display device of claim 15, wherein one or more of air and an adhesive material are disposed in each of the plurality of grooves.

20. The display device of claim 1, wherein:

a sum of the widths of the plurality of discontinuities is less than about 0.23 times of the width of the first area, and each of the widths of the plurality of discontinuities is equal to or less than about 400 μm.

* * * * *